(12) United States Patent
Amleshi et al.

(10) Patent No.: US 12,328,812 B2
(45) Date of Patent: Jun. 10, 2025

(54) CONNECTOR AND PRINTED CIRCUIT BOARD WITH SURFACE GROUND PLANE

(71) Applicant: Molex, LLC, Lisle, IL (US)

(72) Inventors: Peerouz Amleshi, Lisle, IL (US); Pu Xie, Naperville, IL (US); David L. Brunker, Naperville, IL (US); Timothy R. McClelland, Bolingbrook, IL (US); Teng-Kai Chen, San Jose, CA (US)

(73) Assignee: Molex, LLC, Lisle, IL (US)

( * ) Notice: Subject to any disclaimer, the term of this patent is extended or adjusted under 35 U.S.C. 154(b) by 872 days.

(21) Appl. No.: 17/277,308

(22) PCT Filed: Sep. 25, 2019

(86) PCT No.: PCT/US2019/052811
§ 371 (c)(1),
(2) Date: Mar. 18, 2021

(87) PCT Pub. No.: WO2020/068887
PCT Pub. Date: Apr. 2, 2020

(65) Prior Publication Data
US 2022/0039250 A1 Feb. 3, 2022

Related U.S. Application Data

(60) Provisional application No. 62/736,288, filed on Sep. 25, 2018.

(51) Int. Cl.
*H05K 1/02* (2006.01)
*H01R 12/58* (2011.01)
(Continued)

(52) U.S. Cl.
CPC ....... *H05K 1/0225* (2013.01); *H01R 13/6587* (2013.01); *H01R 13/6594* (2013.01); *H05K 1/113* (2013.01); *H01R 12/58* (2013.01)

(58) Field of Classification Search
CPC .. H05K 1/0225; H05K 1/113; H01R 13/6587; H01R 13/6594; H01R 12/58; H01R 12/716; H01R 13/6471
See application file for complete search history.

(56) References Cited

U.S. PATENT DOCUMENTS 7,422,483 B2 * 9/2008 Avery ............... H01R 13/6587
439/607.05
7,468,894 B2 * 12/2008 Bibee .................. H01R 12/523
174/262

(Continued)

FOREIGN PATENT DOCUMENTS

| CN | 103858284 A | 6/2014 |
| CN | 104969669 A | 10/2015 |

(Continued)

OTHER PUBLICATIONS

US 9,504,140 B2, 11/2016, Minich (withdrawn)
(Continued)

*Primary Examiner* — Briggitte R. Hammond

(57) ABSTRACT

Connector (1300) and printed circuit board combinations include opposing electrical ground structures that increase electrical coupling. The combinations also reduce unwanted crosstalk between signals in a printed circuit board.

20 Claims, 29 Drawing Sheets

(51) Int. Cl.
*H01R 13/6587* (2011.01)
*H01R 13/6594* (2011.01)
*H05K 1/11* (2006.01)

(56) References Cited

U.S. PATENT DOCUMENTS

| | | | |
|---|---|---|---|
| 7,794,278 | B2 | 9/2010 | Cohen et al. |
| 8,084,695 | B2 | 12/2011 | Hsu et al. |
| 8,153,906 | B2 | 4/2012 | Hsu et al. |
| 8,212,154 | B2 | 7/2012 | Kashiwakura |
| 8,248,816 | B2 | 8/2012 | Fung |
| 8,398,431 | B1 | 3/2013 | Whiteman, Jr. |
| 9,545,003 | B2 | 1/2017 | Rengarajan et al. |
| 9,730,313 | B2 | 8/2017 | Gailus et al. |
| 10,194,524 | B1 * | 1/2019 | Park .................. H05K 1/116 |
| 11,729,898 | B1 * | 8/2023 | Pickel .............. H05K 1/0222 174/262 |
| 2006/0228912 | A1 * | 10/2006 | Morlion .............. H01R 12/00 439/65 |
| 2008/0096433 | A1 | 4/2008 | Bixler et al. |
| 2011/0188108 | A1 | 8/2011 | Kagaya et al. |
| 2012/0193128 | A1 | 8/2012 | Olsen |
| 2014/0326495 | A1 | 11/2014 | Paniagua |
| 2016/0190747 | A1 | 6/2016 | Regnier et al. |
| 2018/0070439 | A1 | 3/2018 | Charbonneau et al. |
| 2024/0171305 | A1 | 5/2024 | Lee |

FOREIGN PATENT DOCUMENTS

| | | | |
|---|---|---|---|
| CN | 105938945 | A | 9/2016 |
| CN | 107408786 | A | 11/2017 |
| CN | 107535044 | A | 1/2018 |
| CN | 107621859 | A | 1/2018 |
| EP | 2632235 | A1 | 8/2013 |
| JP | 2007522678 | A | 8/2007 |
| JP | 2012511810 | A | 5/2012 |
| JP | 2014522091 | A | 8/2014 |
| JP | 7181388 | B2 | 11/2022 |
| WO | 2013103437 | A1 | 7/2013 |

OTHER PUBLICATIONS

First office action received for Chinese Application No. 201980063165.4 mailed on Mar. 1, 2022, 22 pages (12 pages of English translation and 10 pages of official notification).

Notice of Reasons for Refusal received for Japanese Patent Application No. 2021-515153, mailed on Apr. 5, 2022, 4 pages (2 pages of English translation and 2 pages of official notification).

International Search Report and Written Opinion received for PCT Application No. PCT/US2019/052811, mailed on Jan. 10, 2020, 10 Pages.

Notice of Allowance received for JP Application No. 2021-515153, mailed on Oct. 18, 2022, 05 Pages (02 Pages of English Translation and 03 Pages of Official notification).

* cited by examiner

CONNECTOR AND PRINTED CIRCUIT BOARD WITH SURFACE GROUND PLANE

RELATED APPLICATIONS

This application is a National Phase of International Application No. PCT/US2019/052811 filed on Sep. 25, 2019, which claims priority to U.S. Provisional Application 62/736,288, filed Sep. 25, 2018, and incorporates by reference herein the entire disclosure of both of these applications as if they were set forth in full herein.

TECHNICAL FIELD

This disclosure relates to the field of connectors, more specifically to connectors and the combination of printed circuit boards (PCBs) and connectors, each functioning to conduct data at high data rates.

INTRODUCTION

This section introduces aspects that may be helpful to facilitate a better understanding of the described invention(s). Accordingly, the statements in this section are to be read in this light and are not to be understood as admissions about what is, or what is not, in the prior art.

PCBs used in high speed communication applications may be connected using suitable connectors. Typically, many PCBs may be separated by only a few millimeters (mm), thus they are tightly or densely arranged. An even greater challenge occurs when PCBs are arranged such that within a given PCB that carries multiple discrete signals the required pitch density may approach or exceed having differential signal pairs operating within 1-3 mm of each other. It is quite challenging to eliminate or substantially reduce the ability of one differential signal pair that is being conducted on the same PCB, and so closely aligned from being inductively or capacitively coupled to another adjacent differential signal pair on the same PCB. Adding to the challenge is that as the speed of a signal being conducted by a PCB increases, so too does the tendency for unwanted coupling, commonly referred to as unwanted noise or simply as "crosstalk", to increase.

Further, existing Connector-to-PCB designs match the signal and ground pin positions of a connector's footprint to the corresponding receiving structures such as conductive press-fit pin holes for the respective signal and ground positions. In addition, conductive ground connection vias may be used within a PCB to electrically connect chosen ground-designated layers together to establish a firm low impedance ground return. However, these existing designs do not adequately address the issue of the coupling of unwanted noise.

SUMMARY

The inventors describe various exemplary PCB and connector combinations and related methods that provide reduce crosstalk between signals within a PCB as well as increased coupling between ground structures of a connector and PCB by, among other things, varying the surface area of a ground frame mounting region versus the surface area of an active port region of a PCB, where an active port region comprises a total surface area of anti-pads and a total surface area of signal mounting positions on the PCB.

One embodiment of a PCB may comprise: a top surface for mounting a connector, the top surface having a plurality of signal mounting positions for the connector, a plurality of ground mounting positions for the connector, anti-pads around the plurality of signal mounting positions, and a mounting region with an outer boundary formed between adjacent signal mounting positions of the plurality of signal mounting positions that are outermost wherein the mounting area includes the plurality of signal mounting positions; a ground plane covering the top surface in the mounting region, the top surface in the mounting area further accommodating ground mounting positions and signal mounting positions and including anti-pads around the signal mounting positions of the plurality of signal mounting positions, wherein a surface area of the ground plane covers at least 50% of a total surface area of the mounting region.

In an embodiment, the outer boundary of the mounting region may be formed between adjacent ground mounting positions of the plurality of ground mounting positions that are outermost, wherein the mounting area includes the plurality of ground mounting positions.

In embodiments, (i) the ground mounting positions may comprise ground vias and the signal mounting positions may comprise signal vias; or (ii) the ground mounting positions may comprise ground surface mount pads and the signal mounting positions may comprise signal surface mount pads; or (iii) the anti-pads may comprise at least one anti-pad being around a pair of the signal mounting positions of the plurality of signal mounting positions; or (iv) the anti-pads may comprise an anti-pad being around each of the signal mounting positions of the plurality of signal mounting positions.

In the embodiments described herein the surface area of the ground plane may cover: (i) at least 60% of the total surface area of the mounting region, or (ii) at least 70% of the total surface area of the mounting region, or (iii) at least 80% of the total surface area of the mounting region, or (iv) at least 90% of the total surface area of the mounting region.

An alternative, exemplary PCB may comprise: a top surface for mounting a connector, the top surface having a plurality of signal mounting positions for the connector, a plurality of ground mounting positions for the connector, anti-pads around the plurality of signal mounting positions and a mounting region with an outer boundary formed between outermost signal mounting positions, wherein the mounting area includes the plurality of signal mounting positions; and a ground plane covering the top surface of the mounting region except for signal-vias, and the anti-pads, wherein a surface area of the ground plane covers at least 50% of a total surface area of the mounting region.

Such an exemplary PCB may further include (i) ground mounting positions comprising ground vias and signal mounting positions comprising signal vias, or (ii) ground mounting positions comprising ground surface mount pads and signal mounting positions comprising signal surface mount pads, or (iii) anti-pads comprising at least one anti-pad being around a pair of the signal mounting positions of the plurality of signal mounting positions or (iv) anti-pads comprising an anti-pad being around each of the signal mounting positions of a plurality of signal mounting positions.

Similar to embodiments described previously, in an alternative PCB: (i) the surface area of the ground plane may cover at least 60% of the total surface area of the mounting region, or (ii) the surface area of the ground plane may cover at least 70% of the total surface area of the mounting region, or (iii) the surface area of the ground plane may cover at least 80% of the total surface area of the mounting region, or (iv) the surface area of the ground plane may cover at least 90% of the total surface area of the mounting region.

In addition to inventive PCBs, the inventors describe inventive connectors. One exemplary connector may comprise: a plurality of wafers configured to form a mounting face and a mating face, the mounting face further configured for mounting on a top surface of a circuit board which has a ground plane whose surface area may cover at least 50% of a total surface area of an area opposite a mounting region of the mounting face, the mounting face comprising at least one conductive surface electrically coupled to a ground, the connector being configured for mounting on the circuit board such that the at least one conductive surface is within 0.3 mm of the ground plane and is further configured to operate at a data rate of at least 56 Gbps, wherein the plurality of wafers comprise including signaling wafers, the signaling wafers configured to support a plurality of signal terminals, and each of the plurality of signal terminals comprises a tail portion, a contact portion and a body portion extending between the contact portion and the tail portion, so that (i) the contact portions of the signal terminals are adjacent the mating face and (ii) the tail portions of the signal terminals are adjacent the mounting face and form a mounting region on the mounting face.

Further, in the exemplary connector: (i) the plurality of wafers may comprise ground wafers; (ii) at least one conductive surface electrically coupled to a ground may comprise plated edges of the ground wafers; (iii) the ground wafers may comprise tail inserts, wherein at least one conductive surface electrically coupled to a ground may further comprise a portion of the tail inserts positioned along a mounting region; (iv) the plurality of wafers may include a pair of ground wafers and a pair of signaling wafers, the pair of signaling wafers positioned adjacent to each other and the ground wafers positioned on either side of the adjacent signaling wafers.

In embodiments, the ground wafers may comprise: (i) plated plastic; and/or (ii) tail inserts.

The exemplary connectors described herein and above may further comprise transverse ground blades for electrically coupling ground wafers, where the transverse ground blades may comprise tails configured to electrically couple to a ground plane and the ground wafers may comprise tail inserts. The transverse ground blades may interlock with the tail inserts.

In alternative embodiments, transverse ground blades may extend across ground wafers in a non-perpendicular direction.

In addition to inventive PCBs and connectors the present inventors describe methods that parallel, and involve, the inventive PCBs and connectors described above and elsewhere herein.

Further, the inventors describe methods for reducing crosstalk between signals of a PCB. One such method may comprise forming a PCB having a ground frame mounting region and an active port region, where the active port region comprises a total surface area of anti-pads and a total surface area of signal mounting positions on the PCB; and varying a surface area of the ground frame region and varying the active port region to vary crosstalk between signals in the signal mounting positions.

More particularly, the exemplary method may further comprise increasing the surface area of the ground frame region and decreasing the active port region to decrease crosstalk between signals in the signal mounting positions.

BRIEF DESCRIPTION OF THE DRAWINGS

The present invention is illustrated by way of example and not limited in the accompanying figures in which like reference numerals indicate similar elements and in which:

Further, FIGS. 1-5 illustrate exemplary configurations of receptacles mounted on exemplary PCBs according to embodiments of the invention, FIG. 6 illustrates an exemplary connector that includes one or more sets of wafers, where each set may include one or more ground and signaling wafers arranged to provide one or more ground-signal-signal-ground arrangements or patterns where the presence of ground pins may repeat forming a GSSGGSSG pattern or be represented in a more compact GSSGSSG repeating pattern (where "G" signifies "Ground" and "S" signifies "Signal"), FIGS. 8-11 illustrate arrangements of tail inserts, ground blades, ground planes, ground mounting positions and signal terminal pairs according to embodiments of the invention. FIGS. 12 and 14 illustrate exemplary PCBs with overlaid anti-pads and mounting face conductive surfaces (e.g., ground wafer edges, transverse ground blades) according to embodiments of the invention, FIG. 13 illustrates an exemplary arrangement of a PCB and connector according to an embodiment of the invention, wherein the mating connector with conductive shielding wafers establishes, in effect, a conductive ceiling between active signal ports and the PCB surface establishes, in effect, a conductive floor between active signal ports such that when the connector is engaged at a defined height off the PCB surface, the opposing connector and PCB ground surfaces forming a substantially closed aperture/waveguide between the active signal ports thereby electrically isolating them from each other within the intended band of operational frequencies. FIG. 15 illustrates a cut-away view of a connector mounted to a PCB showing the engagement of a plug module, connector and extended anti-pads on other copper layers of the PCB. FIGS. 16-20 illustrate four different exemplary PCBs and corresponding mounting surfaces, where a surface area of each mounting surface includes a ground plane and anti-pads where the surface area of the ground plane covers a percentage of the total surface area of a corresponding mounting region and a surface area of the anti-pads covers a percentage of the total surface area of the mounting region according embodiments of the invention. FIGS. 21 to 32 illustrate exemplary graphs of insertion losses, crosstalk, impedance and return loss for the four exemplary PCBs and corresponding mounting surfaces in FIGS. 16-20.

In addition, FIG. 33 illustrates an enlarged perspective cross-sectional view of a portion of a mounting face of a connector mounted on a circuit board, in accordance with embodiments of the present invention.

Figure 1:
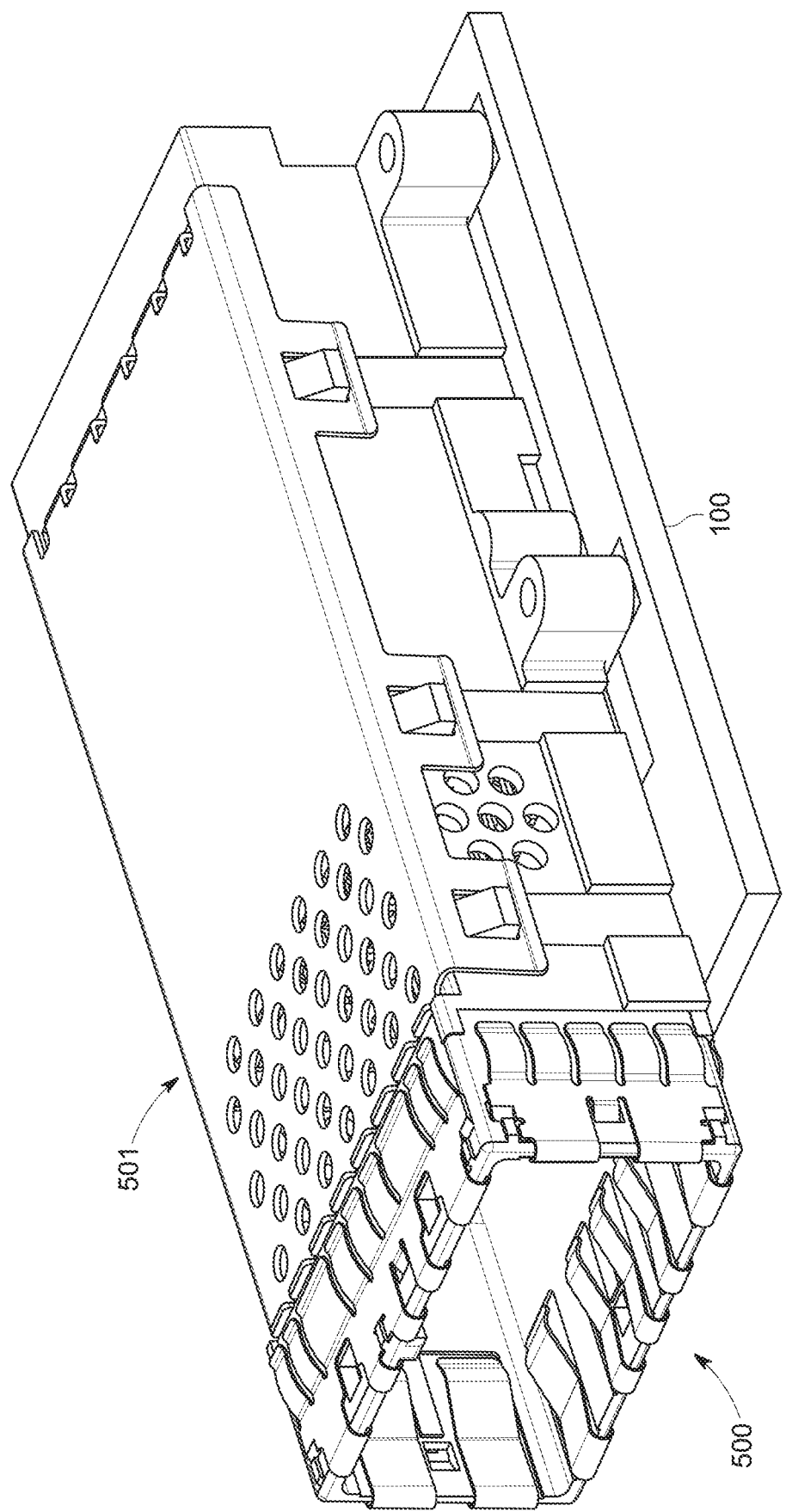
FIGS. 1-33 illustrate embodiments of the invention(s) that reduce unwanted coupled noise, among other things, can be used to support high data rate functionality and the performance of certain embodiments.

Specific embodiments of the present invention are disclosed below with reference to various figures and sketches. Both the description and the illustrations have been drafted with the intent to enhance understanding. For example, the dimensions of some of the elements in the figures may be exaggerated relative to other elements, and well-known elements that are beneficial or even necessary to a commercially successful implementation may not be depicted so that a less obstructed and a more clear presentation of embodiments may be achieved.

DETAILED DESCRIPTION

Simplicity and clarity in both illustration and description are sought to effectively enable a person of skill in the art to make, use, and best practice the present invention in view of what is already known in the art. One of skill in the art will appreciate that various modifications and changes may be made to the specific embodiments described herein without departing from the spirit and scope of the present invention. Thus, the specification and drawings are to be regarded as illustrative and exemplary rather than restrictive or all-encompassing, and all such modifications to the specific embodiments described herein are intended to be included within the scope of the present invention. Yet further, it should be understood that the detailed description that follows describes exemplary embodiments and is not intended to be limited to the expressly disclosed combination(s). Therefore, unless otherwise noted, features disclosed herein may be combined together to form additional combinations that were not otherwise described or shown for purposes of brevity.

As used herein and in the appended claims, the terms "comprises," "comprising," or any other variation thereof is intended to refer to a non-exclusive inclusion, such that a process, method, article of manufacture, or apparatus that comprises a list of elements does not include only those elements in the list, but may include other elements not expressly listed or inherent to such process, method, article of manufacture, or apparatus. The terms "a" or "an", as used herein, are defined as one or more than one. The term "plurality", as used herein, is defined as two or more than two. The term "another", as used herein, is defined as at least a second or more. Unless otherwise indicated herein, the use of relational terms, if any, such as "first" and "second", "top" and "bottom", and the like are used solely to distinguish one entity or action from another entity or action without necessarily requiring or implying any actual such relationship, priority, importance or order between such entities or actions.

The terms "including" and/or "having", as used herein, are defined as comprising (i.e., open language). The term "coupled", as used herein, means at least the energy of an electric field associated with an electrical current in one conductor is impressed upon another conductor that is not connected galvanically. Said another way, the word "coupling" is not limited to either a mechanical connection, a galvanic electrical connection, or a field-mediated electromagnetic interaction though it may include one or more such connections, unless its meaning is limited by the context of a particular description herein.

It should also be noted that one or more exemplary embodiments may be described as a method. Although a method may be described in an exemplary sequence (i.e., sequential), it should be understood that such a method may also be performed in parallel, concurrently or simultaneously. In addition, the order of each formative step within a method may be re-arranged. A described method may be terminated when completed, and may also include additional steps that are not described herein if, for example, such steps are known by those skilled in the art.

As used herein, the term "embodiment" or "exemplary" mean an example that falls within the scope of the invention(s).

The inventors have discovered connector and circuit board configurations that, when used in conjunction with each other, can reduce unwanted coupled noise, among other advantages.

As described further herein, inventive embodiments match connector ground structures to capacitively cooperate with similarly aligned ground structures on an interfacing PCB. The inventive, cooperating ground structures add an additional electrical element—capacitive ground coupling—to the connector footprint in addition to the galvanic signal and ground connections.

Figure 2:
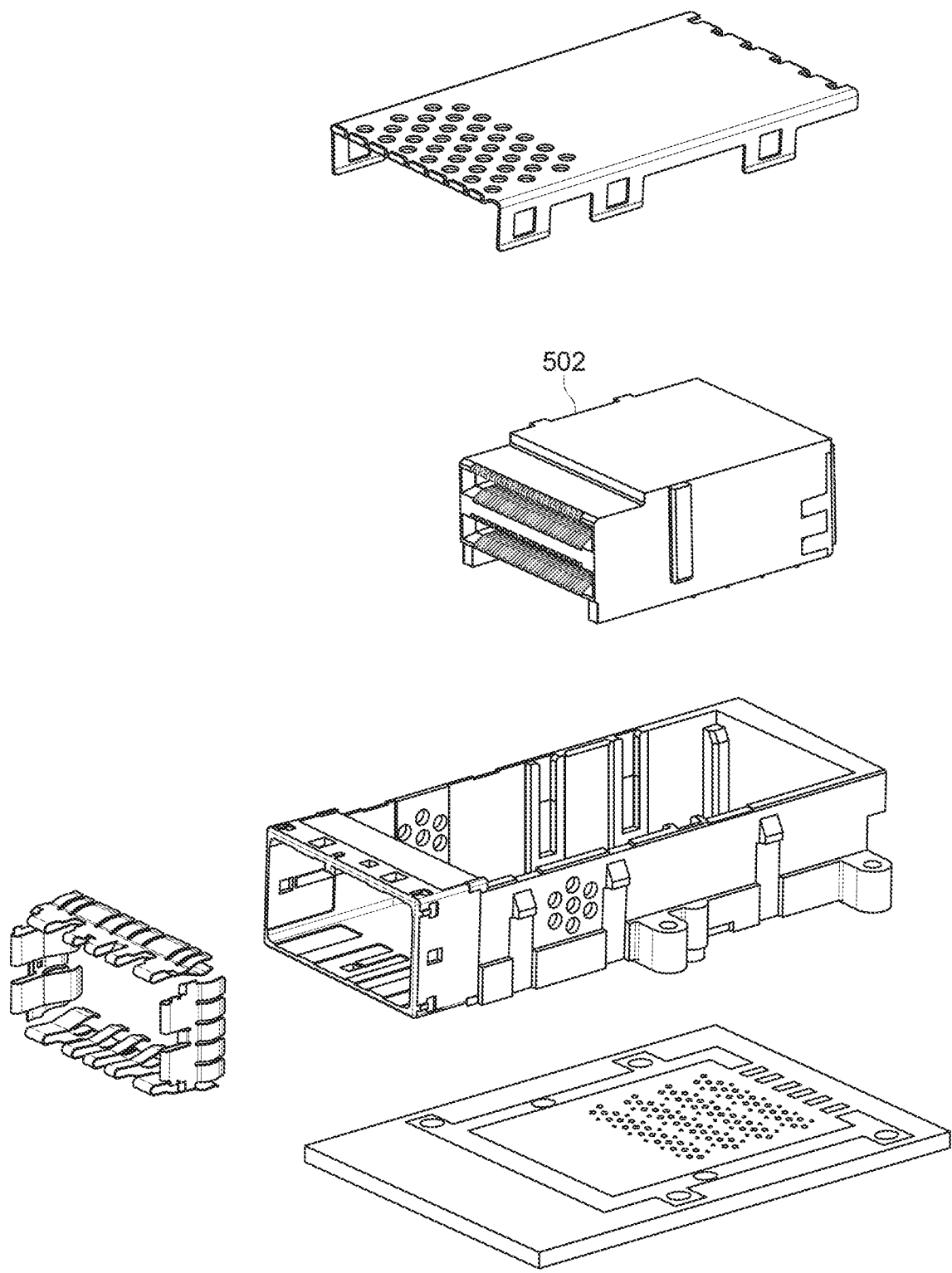
Figure 3:
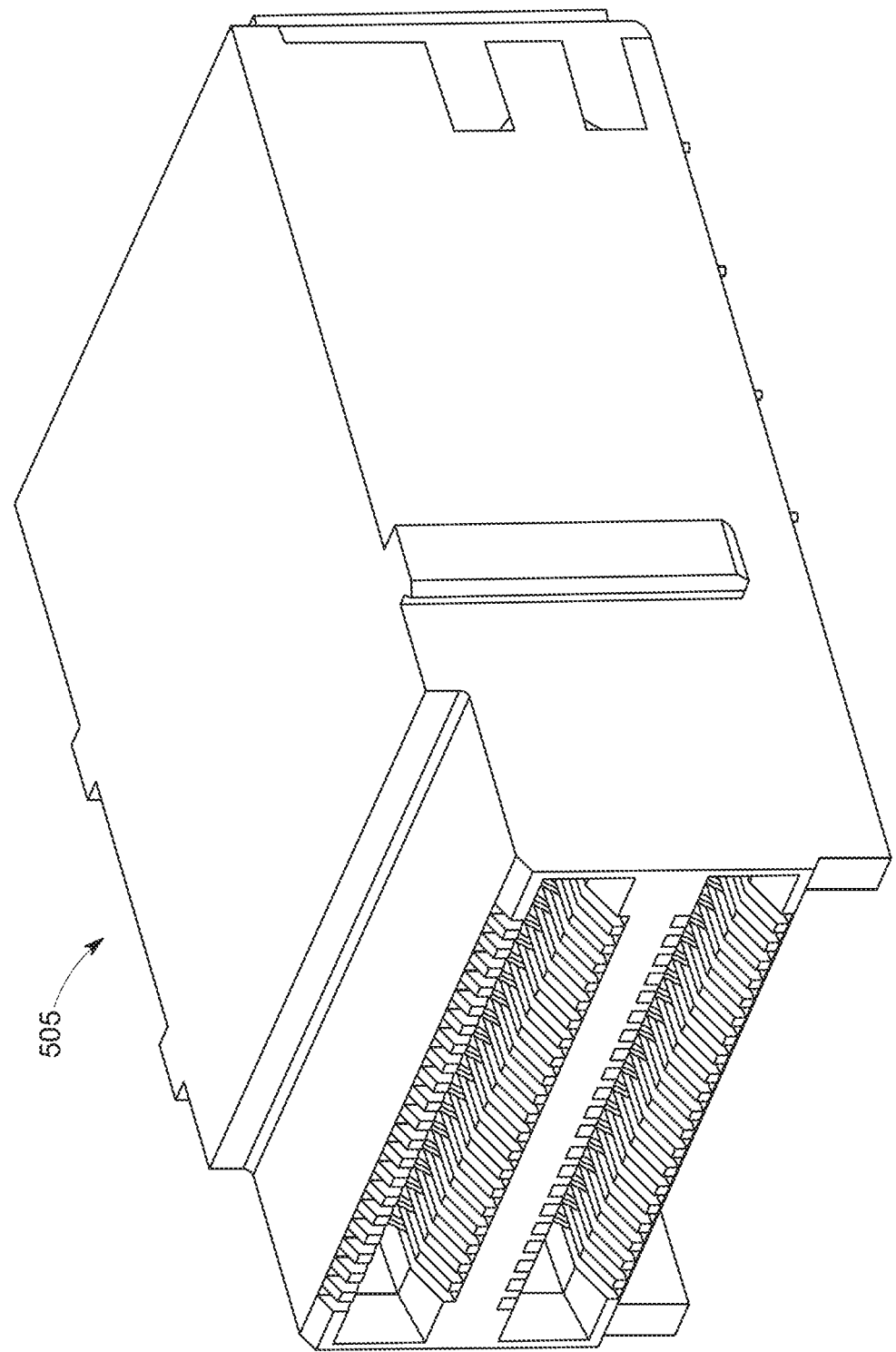

Referring now to FIG. 1 there is depicted an exemplary receptacle 500 of a connector mounted on a PCB 100 such that the receptacle is arranged at a right angle to the CB 100 in order for the receptacle 500 to receive a plug module (not shown). Although not specifically depicted, it should be understood that the same or similar mechanisms of operation could be utilized with a vertical connector that is arranged as a straight-mounted connector. In an embodiment, the receptacle 500 may be formed from a housing 502 arranged or positioned inside of a cage 501, the housing further functioning as a connector 505 (see FIGS. 2 and 3). The cage 501 functions to at least support and control the mating plug module (not shown) and the connector, and also functions to provide electromagnetic interference (EMI) protection. The cage 501 also assists in maintaining mechanical integrity during application operations.

Figure 4:
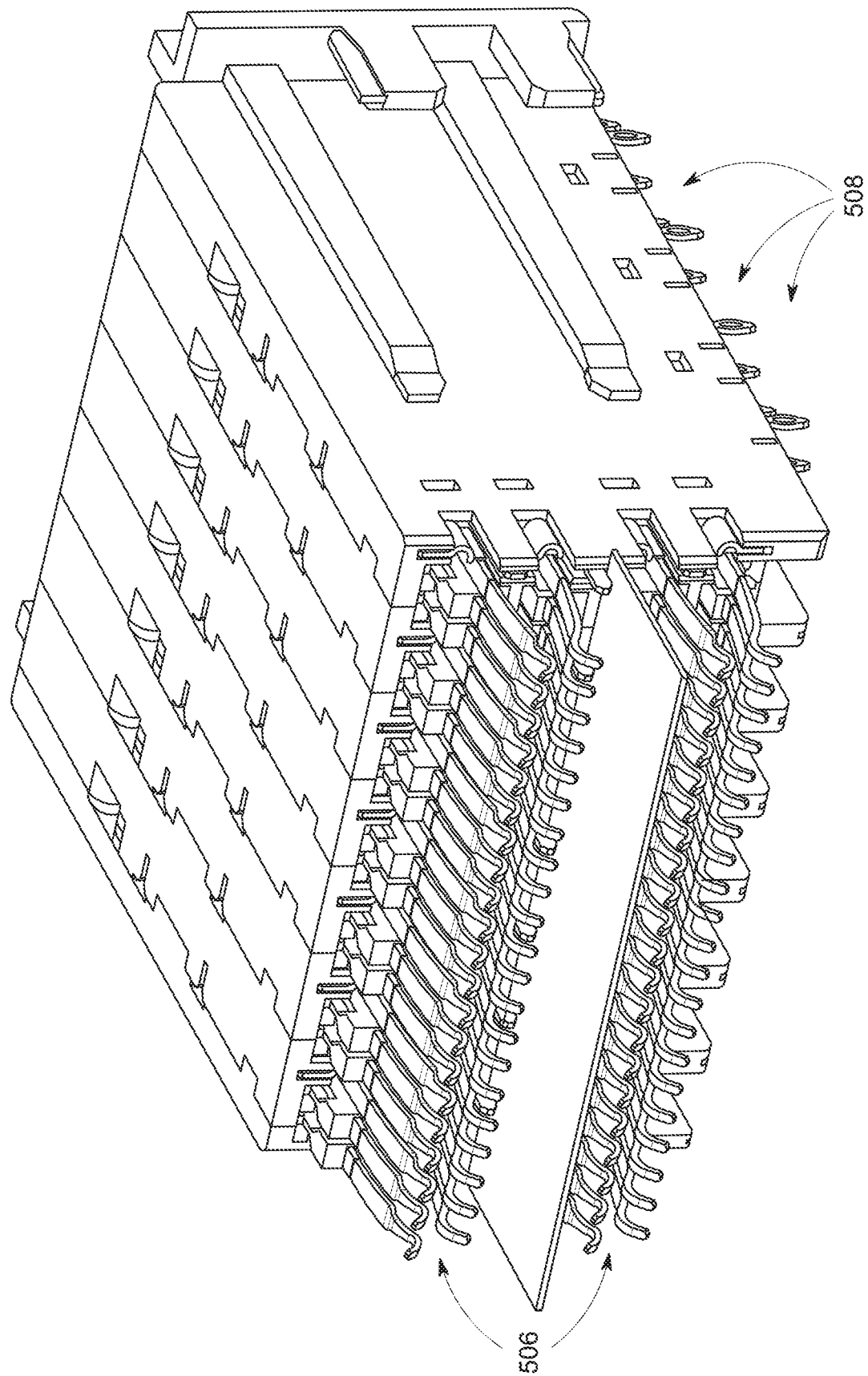
Figure 5:
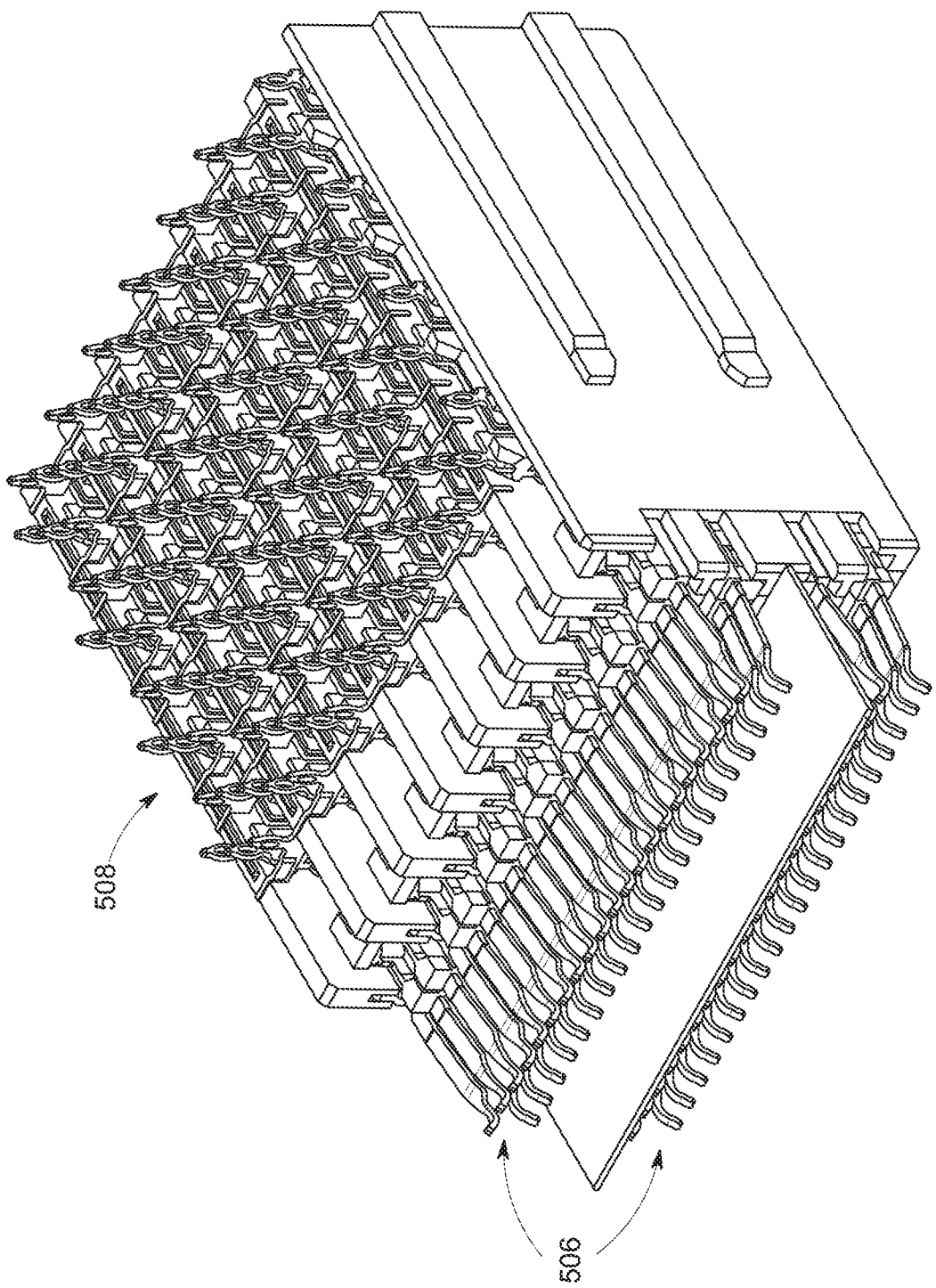

Referring to FIG. 4, in an embodiment the connector functions to support terminals that includes tails 508, contacts 506 and bodies therebetween (not shown) that further function to allow the mating plug module to be electrically connected to a PCB (or to cables if a by-pass design is desired). In the exemplary embodiment in FIG. 4 tails 508 can be configured as press-fit tails. However, in alternative embodiments terminal tails may be configured in various forms other than press-fit to support a desired mounting configuration or arrangement (e.g., surface mounting) or interconnection (e.g., to cables). In the embodiment of FIG. 4 (and FIG. 5), the receptacle 500 may be press-fit onto a PCB for ease of assembly. Accordingly, terminals of the connector should be aligned with terminals on the cage. In an embodiment, the cage 501 may comprise a metal cage. Further, tails 508 may be arranged in a fairly repeatable arrangement and may comprise dimensions, with respect to one another, that are similar.

Figure 6:
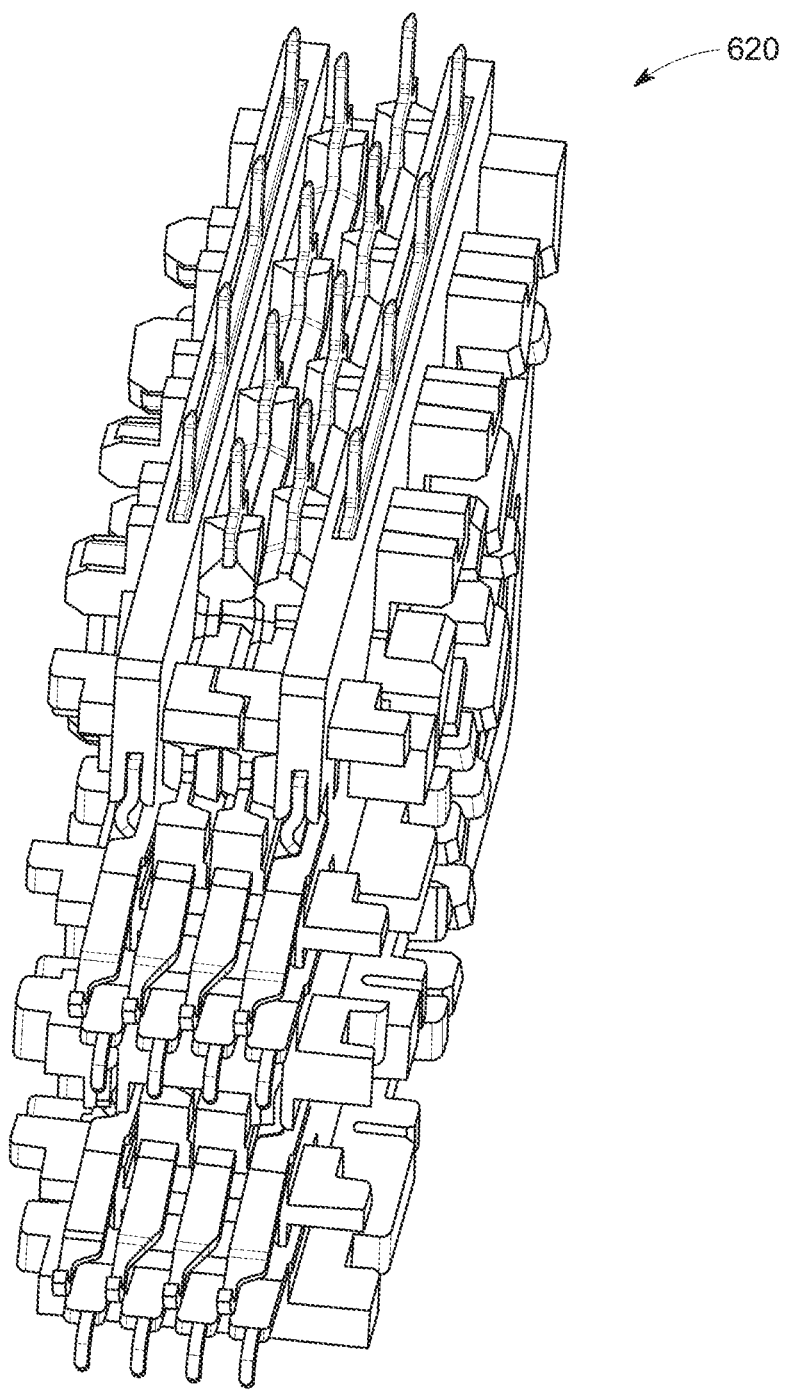
Figure 7:
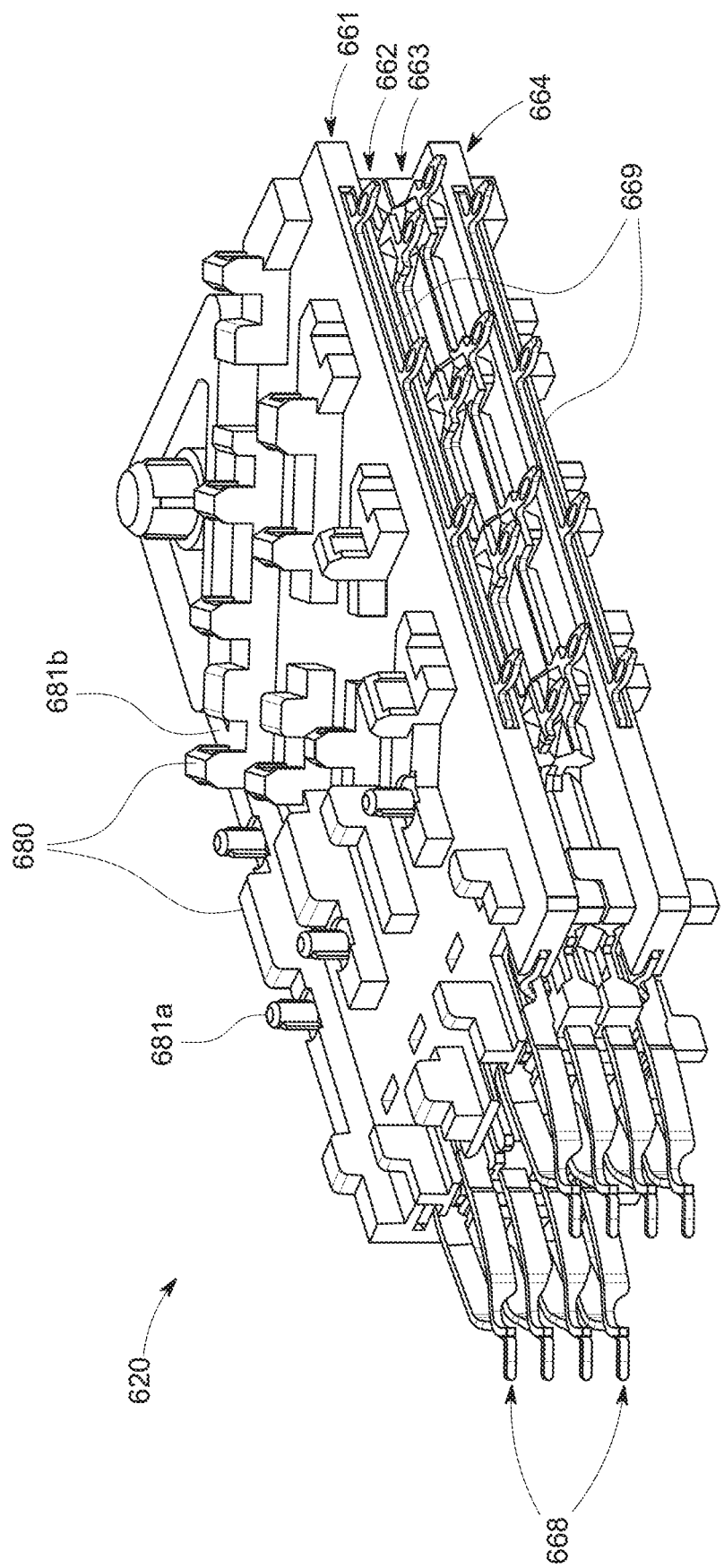
Figure 8:
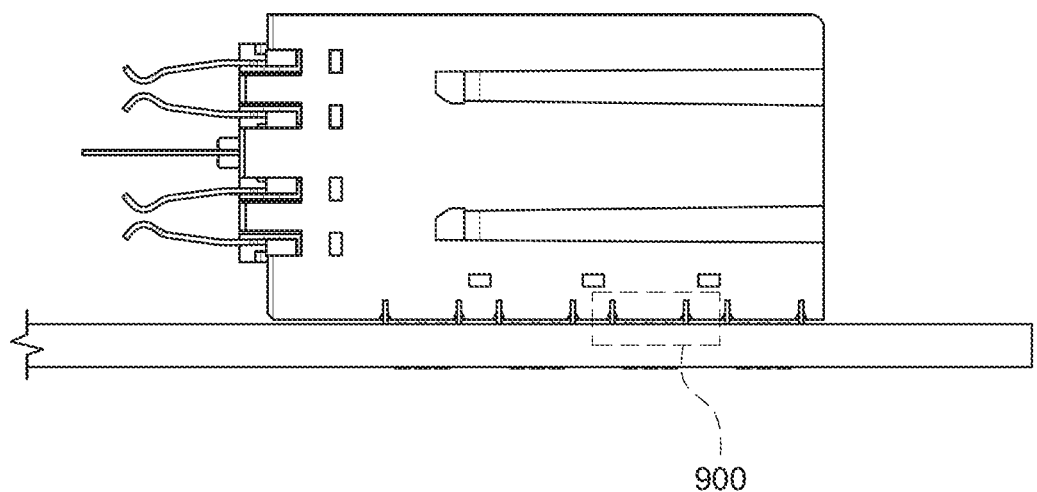
Figure 9:
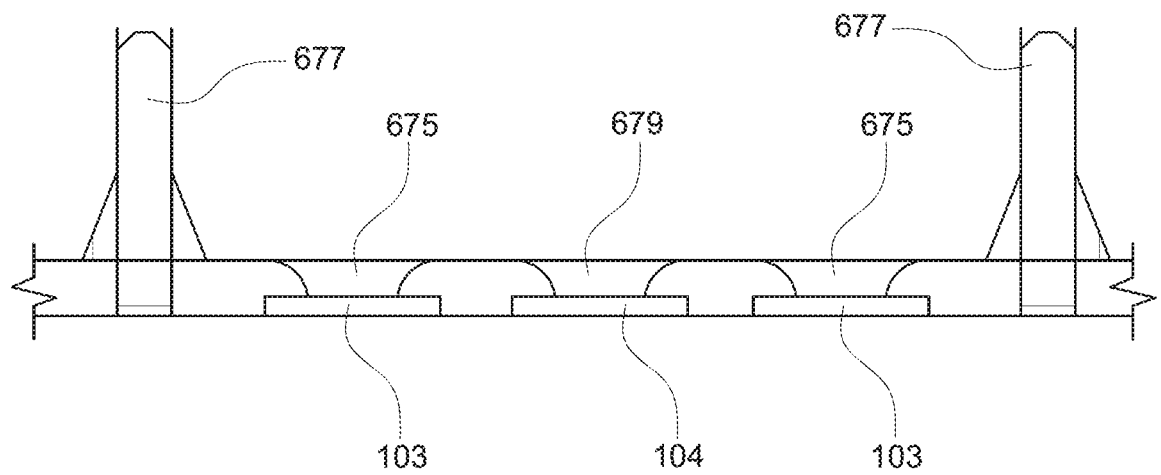

Referring now to FIGS. 6 and 7, an exemplary connector may include one or more sets of wafers 620. In an embodiment, wafer set 620 includes ground wafers 661, 664 and signaling wafers 662, 663 (see FIG. 7) arranged as a ground-signal-signal-ground pattern. The particular application may repeat, as shown, in a GSSGSSG pattern or include additional ground wafers forming a GSSGGSSG repeating pattern (where "G" signifies "ground" and "S" signifies "signal"). In the depicted embodiment, signaling wafers 662 and 663 each include an insulative frame (e.g., molded plastic, such as a liquid crystal polymer (LCP)) that functions to support the signal terminals therein (each signal terminal having a contact and associated tail as depicted in FIG. 7). In the depicted embodiment in FIG. 7, ground wafers 661 and 664 are formed of a metalized plastic to enable conduction and commoning. Further, such a metalized plastic may be: (1) doped to become sufficiently conductive, (2) plated, (3) doped and plated, (4) inked, (5) etched, or (6) some combination of any of the preceding in order to function at least as a formed, generally conductive surface. In embodiments, in the case of plating, the plated metallized plastic may cover the entire surface area of a ground wafer or may cover less than the entire surface area of the ground wafer (i.e., selective plating). Thus, in some embodiments, the entire surface of an insulative frame (molded plastic, for example, such as LCP) may be plated to become conductive. Accordingly, in an embodiment a ground wafer may initially comprise a stamped/formed conductive plate (perhaps including ground contacts and tail features), over-molded with a plastic and then plated. Contacts and/or tail features may be inserted into the ground wafer, if needed, either before or after plating. These conductive tail features function to provide a direct electrical conduction path between the ground wafers and an interfacing PCB.

In some embodiments, metal contact inserts 668 and metal tail inserts 669 may then be stitched or inserted into pockets in the ground wafers 661,664 (as shown after stitching in FIG. 7) rather than being formed through a terminal over-molding process (as are the terminals of signaling wafers 662, 663). This stitching of inserts (whether for the contacts or tails or both) can be done for all or any of the ground wafers 661, 664. Similar contact and/or tail inserts may be formed for various signaling wafers or power wafers and then stitched into those wafers as desired. In addition, the tail inserts may comprise press-fit tail inserts or surface-mount tail inserts. In additional embodiments, instead of tail inserts ground wafers 661, 664 may comprise plated or metalized conductive plastic tails. Such tails may be formed as part of any molded wafer and either be conductive or be made conductive (plated, for example).

As depicted, exemplary ground wafers 661 and 664 may comprise many raised areas (nubs) 680, pegs 681*a* and recesses 681*b* for mating with one another when sandwiching signaling wafers 662, 663. In some embodiments, the pegs 681*a* and recesses 681*b* of one ground wafer may form or be arranged as an interference fit with an opposing sandwiching ground wafer. Further, in some embodiments the raised areas of each may meet to substantially fill the voids of the sandwiched signaling wafer pair. Also, depending on the embodiment, some or all of the ground wafer recesses 681*b* may instead be formed as holes in a ground wafer for receiving pegs 681*a* of the opposite ground wafer. Thus, it should be understood that the arrangement of pegs 681*a* and recesses 681*b* depicted in FIG. 7 is merely one example—many variations are possible.

In one embodiment, it is desirable for some or all of the of the raised areas (nubs) 680, pegs 681*a* and/or recesses 681*b* to be metalized (i.e., comprise metalized elements) to enable conduction and commoning between ground wafers 661, 664.

Figure 33:
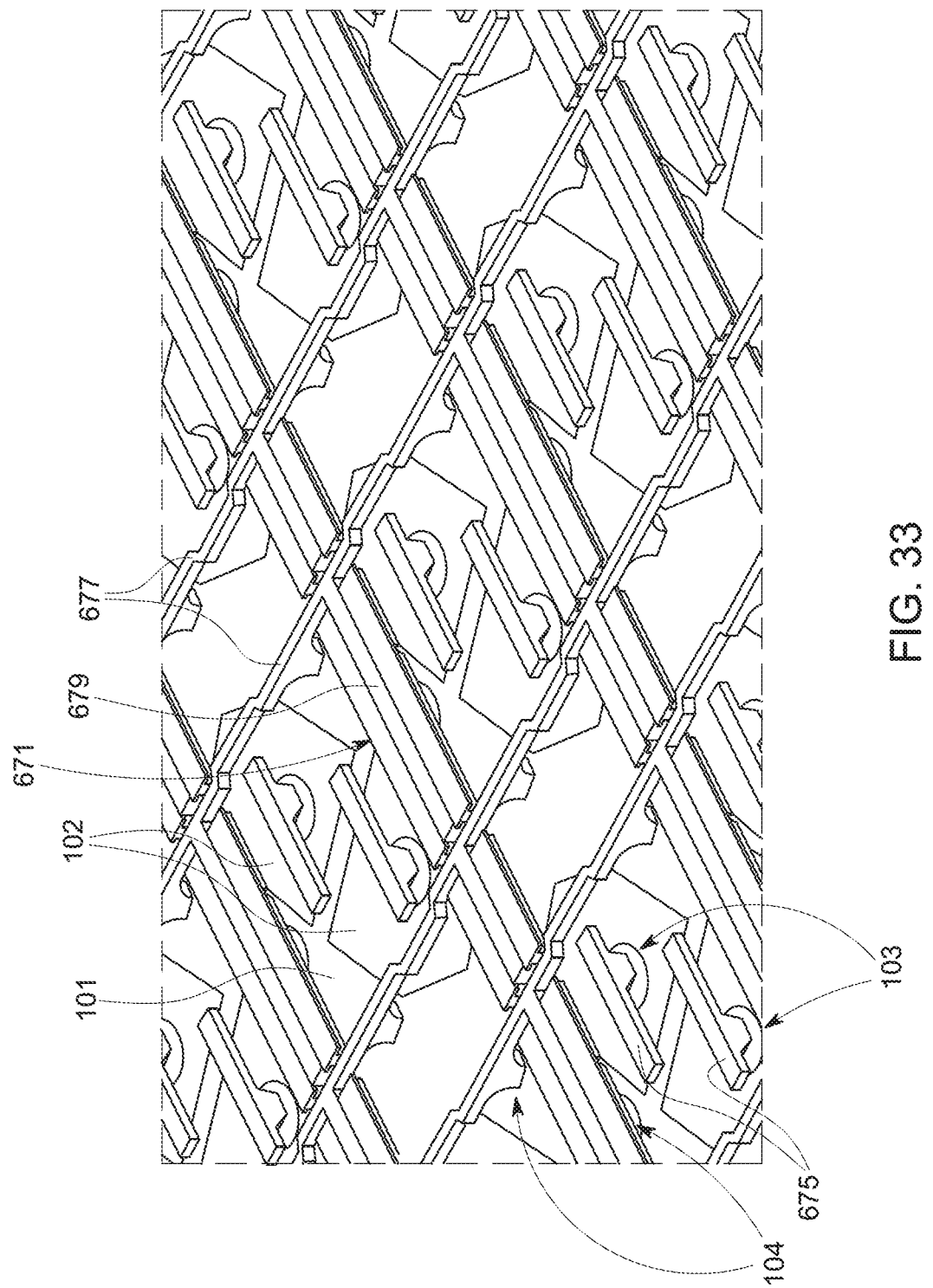

Referring now to FIG. 33, there is illustrated an exemplary, enlarged perspective and cross-sectional view of an exemplary mounting region of an exemplary connector showing the connector's mounting to a PCB in accordance with some embodiments of the present invention. In more detail, a portion of the top surface of the PCB is depicted in FIG. 33 that includes a ground plane 101 and anti-pads, such as anti-pads 102. Signal mounting positions 103 and ground mounting positions 104 for the connector are also depicted. In the embodiment depicted, signal mounting positions 103 comprise signal vias 103 while ground mounting positions 104 comprise ground vias 104. In other embodiments, such as those where a PCB is combined with a surface mounted connector, signal mounting positions might comprise signal surface mount pads and ground mounting positions might comprise ground surface mount pads. Also, although anti-pads 102 are shown around each of the two signal mounting positions, in other embodiments, anti-pads 102 could be joined together and instead be a single anti-pad around the two (or possibly more) signal mounting positions. In the exemplary embodiment, the surface area of the ground plane 101 is depicted as covering somewhat more than 50% of the total surface area of the mounting region shown in FIG. 33. A mounting region can be defined to be the smallest area that includes all of the signal mounting positions. It is desirable for the surface area of the ground plane to cover more than 50%, 60%, 70%, 80% or even 90% of the total surface area of a mounting region. Unless there is a need for other top surface features, such as larger anti-pads or additional vias, for example, it is desirable for the surface area of the ground plane to cover as much of the total surface area of the mounting region as possible.

Figure 10:
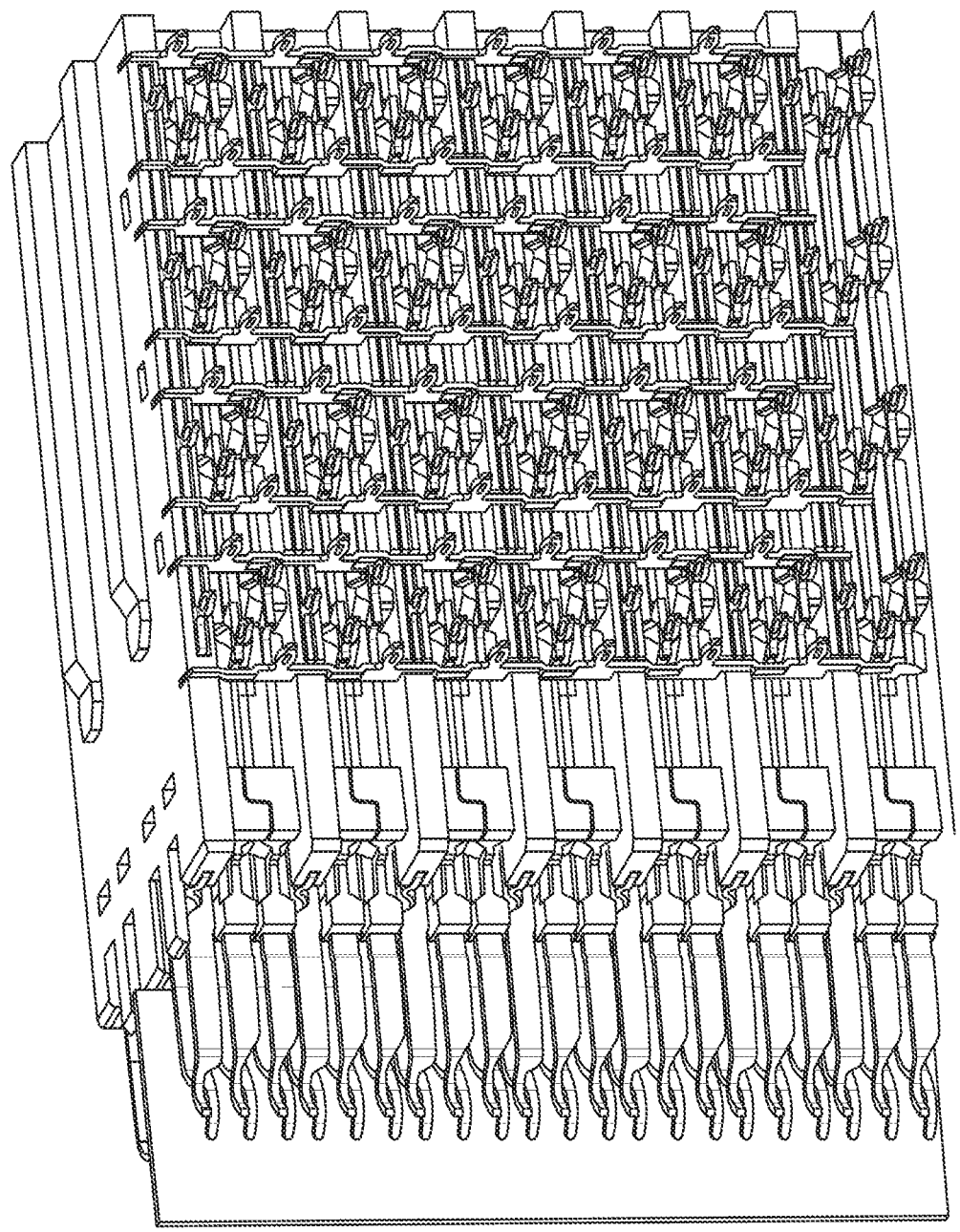
Figure 11:
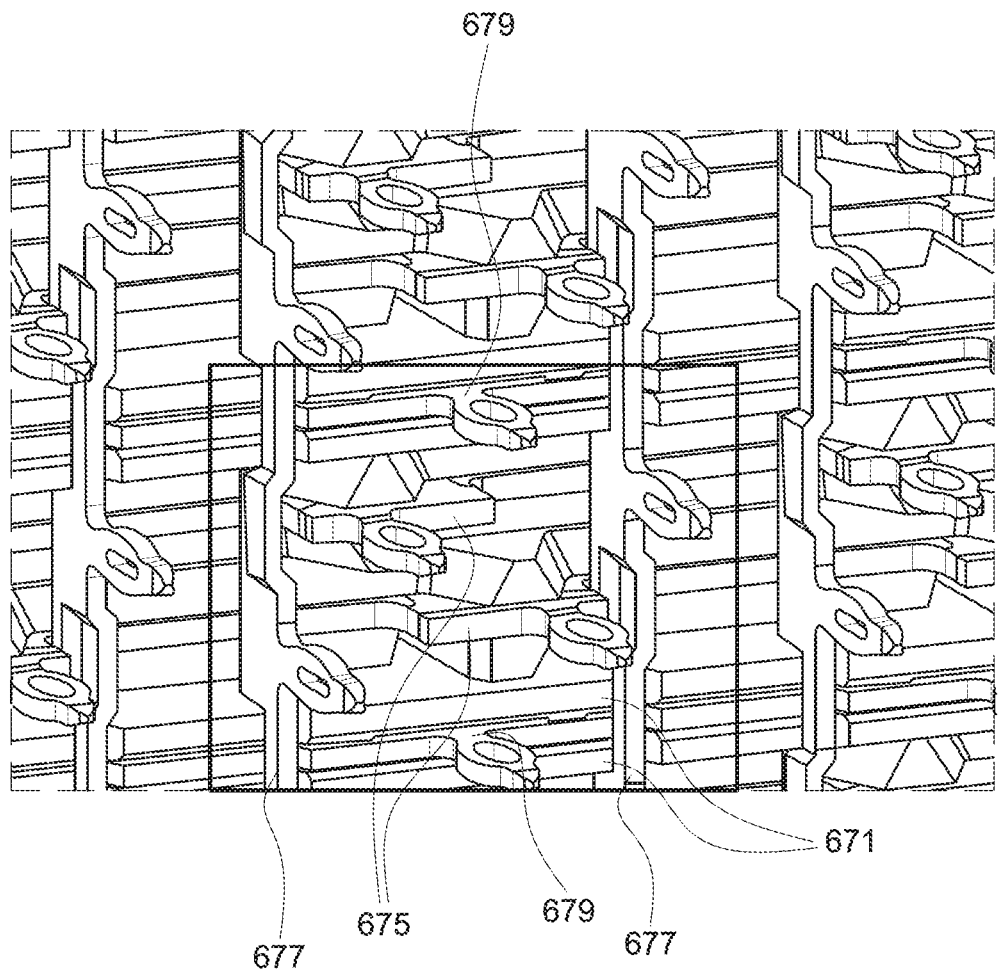

Again, with reference to FIG. 33, a cross-sectional view of the mounting region of the connector is shown where part of signal terminals are depicted. In particular, a portion of tail portions 675 of signal terminals are shown. In this embodiment, tail portions 675 comprise press-fit tail portions. In other embodiments, the tail portions may be configured for surface mounting to the PCB instead. Part of the ground wafers and tail inserts (such as ground wafer 671 with its tail insert 679) of the connector and part of transverse ground blades 677 are also depicted. In an embodiment, the transverse ground blades 677 may be arranged or configured to electrically connect across all column-aligned ground wafers 671 that are positioned, for example, substantially perpendicular to the blades 677 (i.e., the geometric plane that includes the blades 677 "crosses" the geometric plane that includes the wafers 671). It should be understood, however, that the ground blades need not be perpendicular to the ground wafers, but rather extend across them laterally at some other angle, as desired. Further, depending on the embodiment, the transverse ground blades 677 may interlock with the tail inserts 679 or fit into slots formed in the ground wafers 671 or they may be arranged to do both in order to electrically connect to the ground wafers they cross. (See, for example, FIGS. 8-11, where FIG. 10 depicts the underside or mounting face of a connector and FIG. 11 depicts an enlarged view of a portion of FIG. 10). Both the transverse ground blades 677 and the tail inserts 679 may also be electrically coupled to ground plane 101 through ground mounting positions 104. In the embodiment depicted, multiple transverse ground blades (such as transverse ground blades 677) are positioned between rows of signal terminal tail pairs 675.

Ground wafer 671 may be formed of metalized plastic to enable conduction and commoning. As mentioned previously, metalized plastic may take various forms. Ground wafer 671 may be plated over its molded plastic frame, including the edge facing its mounting region. The face of the connector that faces the mounting region of the connector comprises multiple conductive surfaces electrically coupled to ground, the plated edges of the ground wafers being primary among these conductive surfaces. The portion of the tail inserts and transverse (or lateral) ground blades that are positioned along the face of a mounting region may also comprise conductive surfaces electrically coupled to ground. However, as a matter of surface area, the plated edges of the ground wafers 671 are more substantial than the ground blade edges or the tail insert edges, at least for the embodiment depicted.

Figure 12:
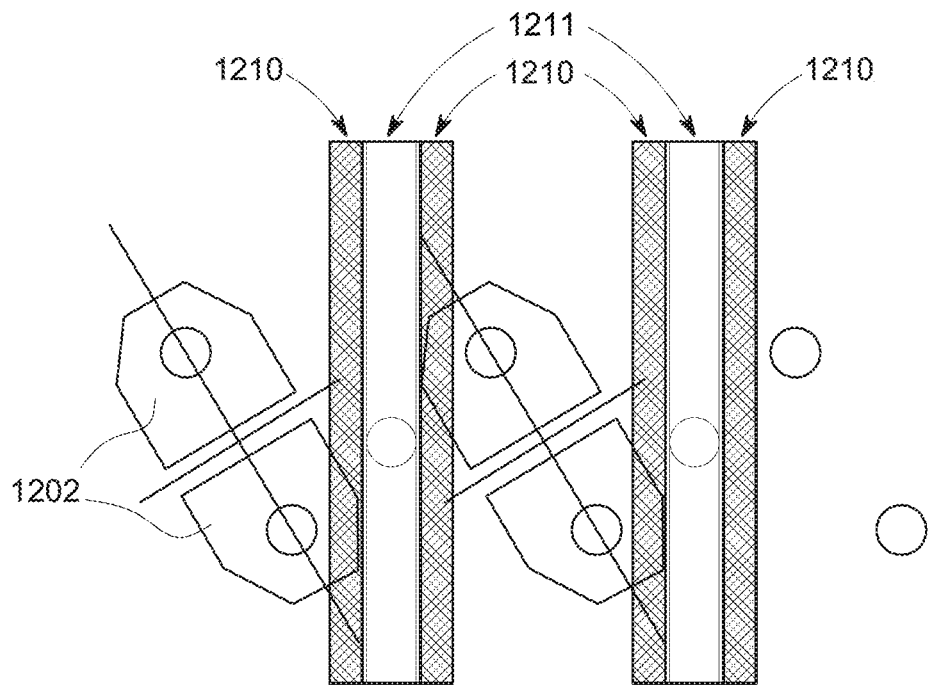
Figure 14:
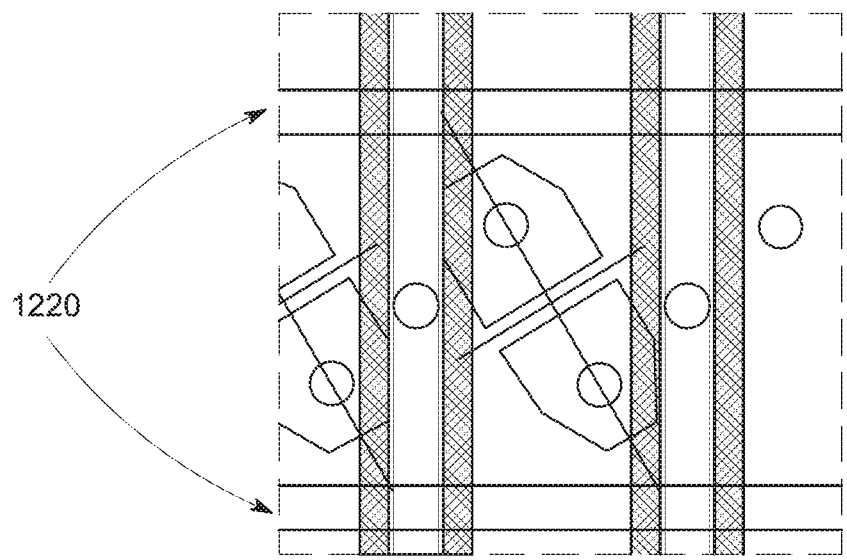

Referring now to FIGS. 12 and 14 there is depicted exemplary configurations where a PCB with anti-pads 1202 and the face of a mounting region's conductive surface are overlaid on one another. FIG. 12 shows edges 1210 of the face of a mounting ground wafer and portion of tail inserts (in the ground wafer) 1211 positioned along the mounting face, while FIG. 14 additionally shows the portion of transverse ground blades 1220 that are positioned along the face of the mounting region.

Figure 13:
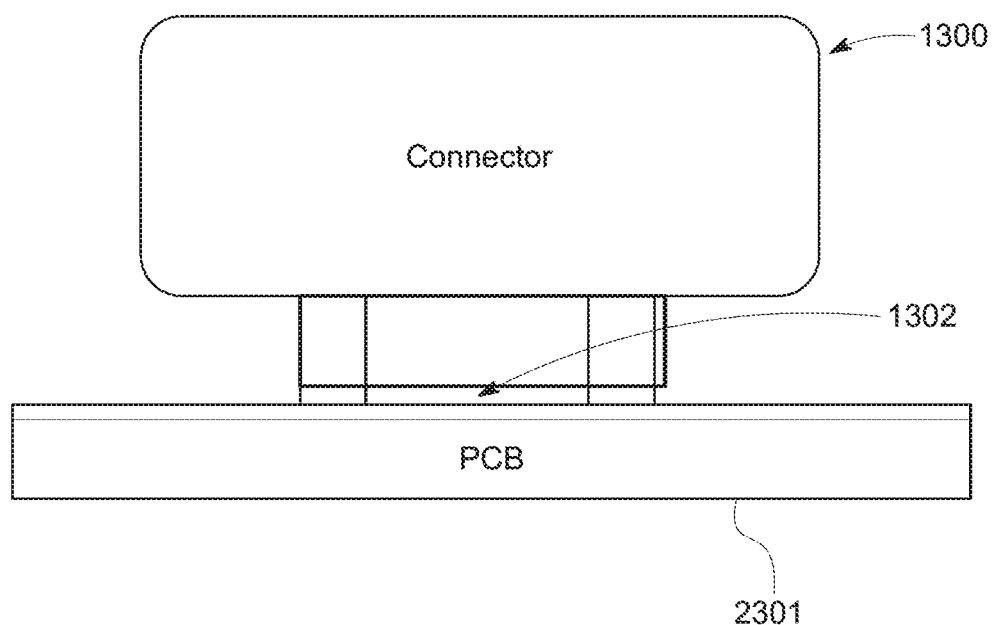

Referring now to FIG. 13 there is depicted a general configuration or arrangement of a combination of a connector 1300 mounted to a PCB 1301. As shown, because a surface of the connector 1300 is not flush (i.e., touching) with a surface of the PCB 1301 there exists an aperture/waveguide region 1302 between the surface of the PCB 1301 and the electrically-coupled ground structures on the surface of the connector 1300 that are closest to the PCB 1301. In embodiments of the invention, it is desirable for this aperture/waveguide region 1302 to be as small as possible to reduce unwanted noise.

More particularly, unwanted noise can be a significant deteriorating factor that limits operating margin and functional channel length when a connector operates at elevated speeds of 56 Gbps-PAM4 to 112 Gps-PAM4 and other non-modulated applications such as 56 Gbps-NRZ.

Recognizing this, the inventors provide exemplary embodiments herein where a connector is mountingly combined with a PCB. One such embodiment is illustrated in FIG. 33 as described previously where a connector may be configured or arranged for mounting such that one or more of the conductive surfaces of a face of a mounting region may be nominally within 0.3 mm of a surface of ground plane 101 of the PCB. Thus, the underside surface of ground wafer 671 (hidden from view) may be within 0.3 mm of the surface of the portion of ground plane 101 of the PCB immediately beneath it. In an alternative embodiment, it is desirable for the conductive surfaces of the face of the mounting region to be within 0.15 mm or closer to the surface of the ground plane 101.

It should be understood that, when configured or arranged using the dimensions set forth in the paragraph above, the surfaces of the inventive connector and PCB combination discussed therein may function to increase the electrical coupling of their electrical grounds to a degree that is an improvement over existing configurations. Further, it should be understood that rather than describe the same improvement in electrical coupling in terms of mechanical dimensions, such improvements may also be described by stating that the proximity between the surface of an inventive ground plane of a PCB and one or more of the inventive conductive surfaces of a connector's mounting face should preferably not exceed a wavelength fraction of $1/15$ of a wavelength of the highest intended operational frequency, within the transition region between the surface of the PCB and the conductive surfaces of the connector's mounting face.

It is also believed that the inventive combination of connectors and PCBs, which include a configuration or arrangement where a surface of a ground plane of a PCB and the conductive surfaces of a face of a mounting region of a connector, are close together (0.3 mm or closer, for example) provide an improved, enhanced capacitive coupling over existing configurations. Such an enhanced capacitive coupling enables substantially equipotential plane surfaces to be achieved such that a more effective RF ground coupling is established and maintained between the surface of the PCB and the interfacing connector, thereby further providing significantly improved noise reduction. Yet further, it is believed that the enhanced capacitive coupling provided by the inventive connector/PCB combinations functions to form an electrical shunt between the surface of the ground plane of the PCB and the conductive surfaces of the face of the mounting region of the connector. This shunt capacitance is believed to be substantially parallel to the direct galvanic conduction of the multiple pressed-in ground pins. It should be noted that the presence of ground currents in a signal's return path are not always confined to ground pins. Across the conductive plane of the shielding wafers, time-varying difference voltages are capable of supporting "local" displacement current differences that are not effectively communicated to the surface of the PCB resulting in possible voltage differences between the connector's conductive wafers and the PCB's ground plane. Realizing this, the inventors provide embodiments where opposing PCB and conductive connector surfaces are substantially proximal to one another in order to support parallel plate capacitance between the opposing PCB and conductive connector surfaces which, in turn, provides a capacitive coupling path to couple a displacement current from conductive wafers to the ground plane surface of the PCB. This capacitive coupling path works to keep the voltage differences between connector and PCB to a minimum, thus substantially equipotential.

Figure 15:
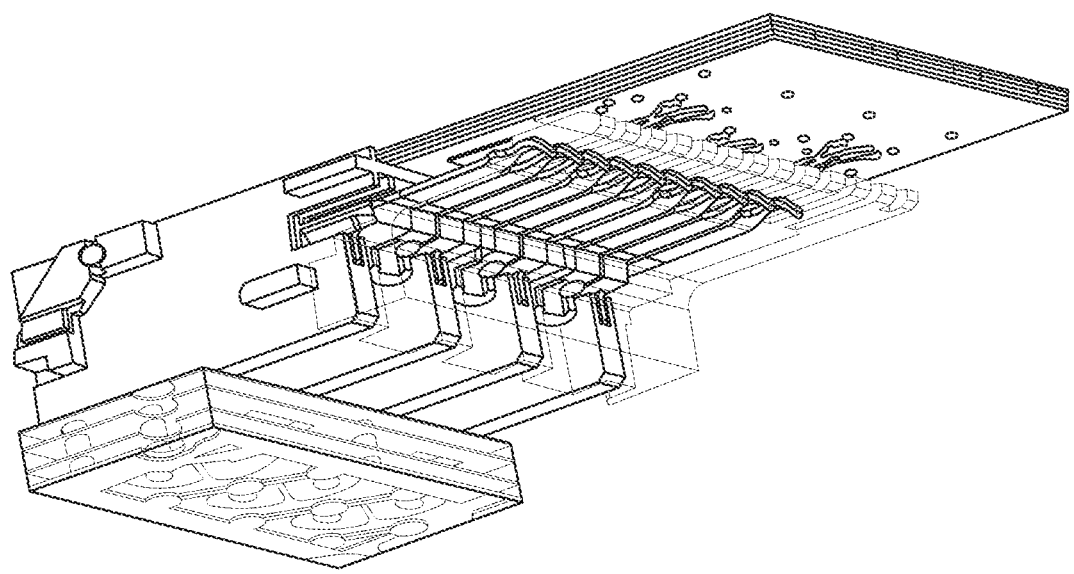
Figure 16:
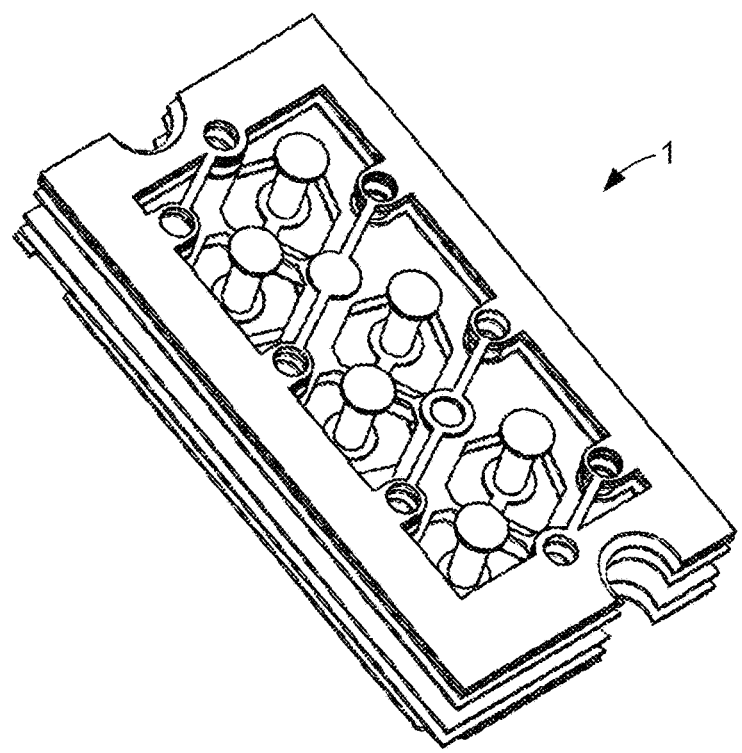
Figure 17:
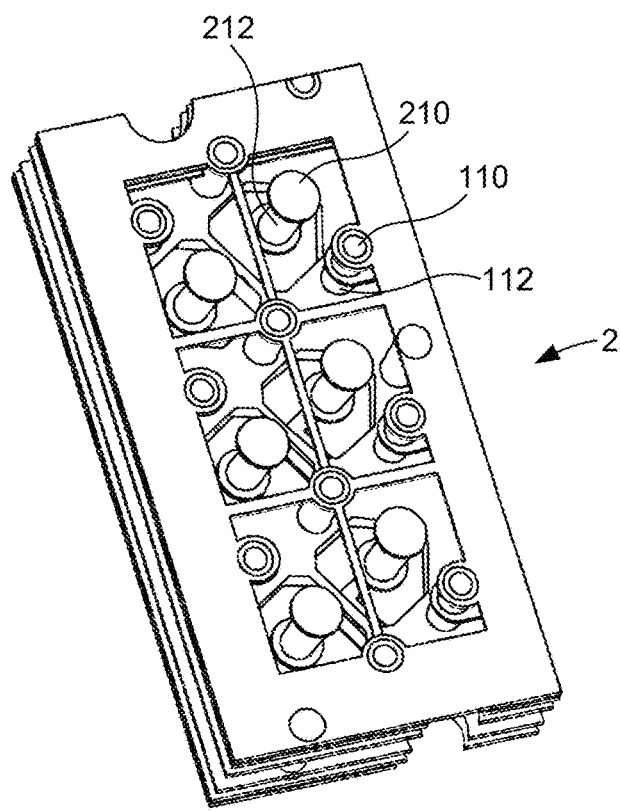
Figure 18:
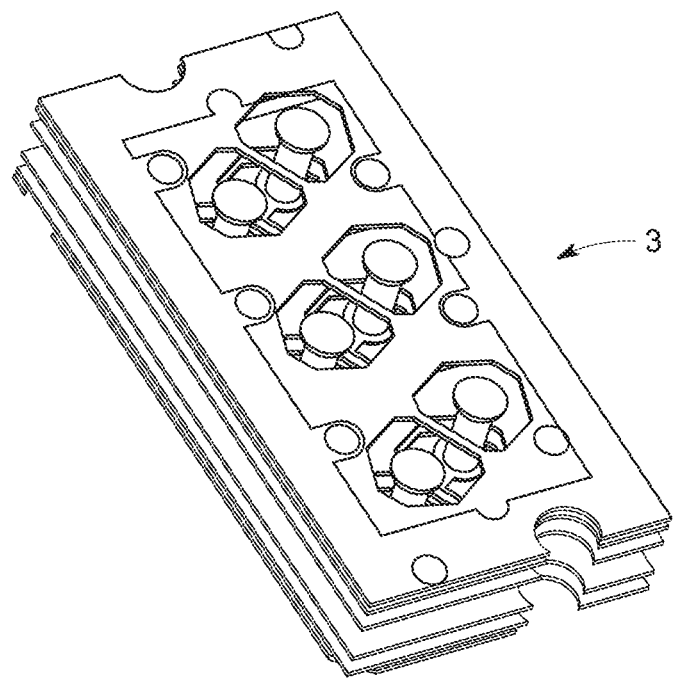
Figure 19:
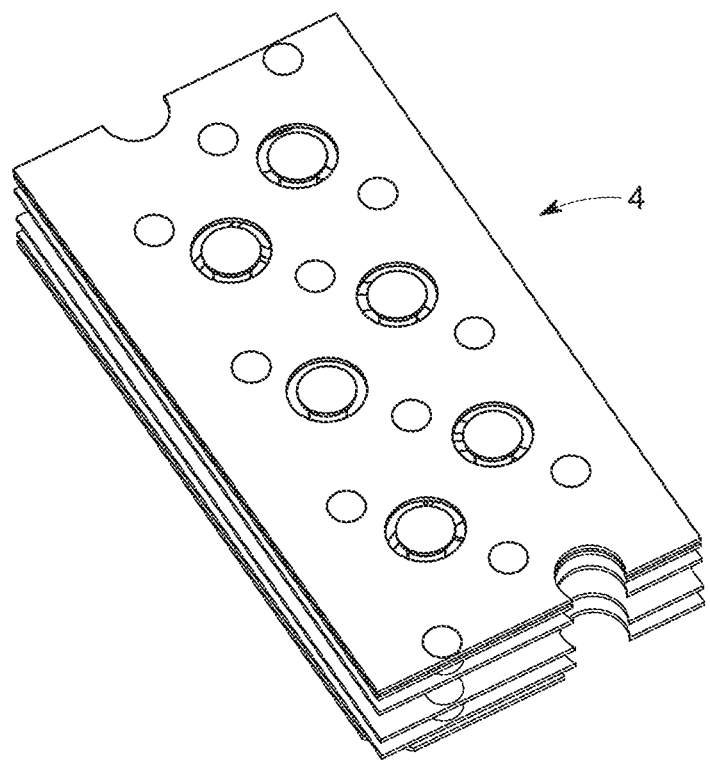

Referring now to FIG. 15 there is depicted a cut-away of a connector 1500 mounted to a PCB 1501 showing the engagement of a plug module, connector and extended anti-pads on other copper layers of the PCB. On the PCB surface these anti-pads encompass the active signal mounting positions/ports thereby forming an active port region. When these active ports are extended vertically below the PCB's surface they, in effect, become active cavities that are dielectric filled but devoid of copper and bounded by the PCB ground frame copper portion. These active cavities can be managed to preserve high-speed electrical performance through to the desired breakout signal layer.

Referring now to FIGS. 16-32, there is depicted connector and various, exemplary PCB arrangements according to embodiments discovered by the inventors using simulations. In more detail, FIGS. 16-19 show four different exemplary PCBs labeled 1 through 4 and their corresponding, simulated mounting regions where a surface area of each mounting region includes a ground plane having a surface area and anti-pads having a combined, anti-pad surface area. The PCBs 1-4 include examples of ground mounting positions and signal mounting positions. The PCB 2 shown in FIG. 17, as one example, includes a number of ground mounting positions, such as the ground mounting surface pad 110 and the ground via 112. The PCB 2 also includes a number of signal mounting positions, such as the signal mounting surface pad 210 and the signal via 212. As described herein, the ground plane surface area and combined anti-pad surface area may be varied among the PCBs 1-4 such that the ground plane surface area and combined anti-pad surface area within each mounting region of the PCBs 1-4 are different. Accordingly, each mounting region of the PCBs 1-4 has a different percentage of ground plane coverage as shown in Table 1 below. Said another way, as the ground plane surface area, represented as a first percentage of the total possible surface area of each mounting region, increases from PCBs 1-4, the combined anti-pad surface area, represented as a second percentage of the total surface area of each mounting region, decreases. It should be noted that the mounting regions of the PCBs 1-4 include different anti-pad shapes and sizes that correspond to different anti-pad surface areas.

TABLE 1

Exemplary Anti-Pad Areas for PCBS 1-4 in FIGS. 16-32

| Anti-Pad Identification | Max. Ground Frame Area (mm$^2$) | Active Signal Ports (mm$^2$) | Ground Frame Remaining (mm$^2$) | Ground Frame (Plane) Utilization Fraction (mm$^2$) | Active Signal Port Utilization Fraction (mm$^2$) | Ground Frame (Plane) Utilization Percent (mm$^2$) | Active Signal Post Utilization Percent (mm$^2$) |
|---|---|---|---|---|---|---|---|
| 1) | 29.03 | 17.97 | 11.06 | 0.38 | 0.62 | 38.10 | 61.90 |
| 2) | 29.03 | 16.80 | 12.23 | 0.42 | 0.58 | 42.13 | 57.87 |
| 3) | 29.03 | 10.06 | 18.97 | 0.65 | 0.35 | 65.35 | 34.65 |
| 4) | 29.03 | 4.39 | 24.64 | 0.85 | 0.15 | 84.87 | 15.13 |

It should be understood that the values in Table 1 are exemplary. Further the exemplary, ground frame utilization percentages are calculated after removal of the area dedicated to the active signal ports (see explanation below). The ground frame percent utilizations corresponds to the amount of area dedicated to a surface ground plane area compared to the maximum area within a specified ground frame boundary.

Figure 20:
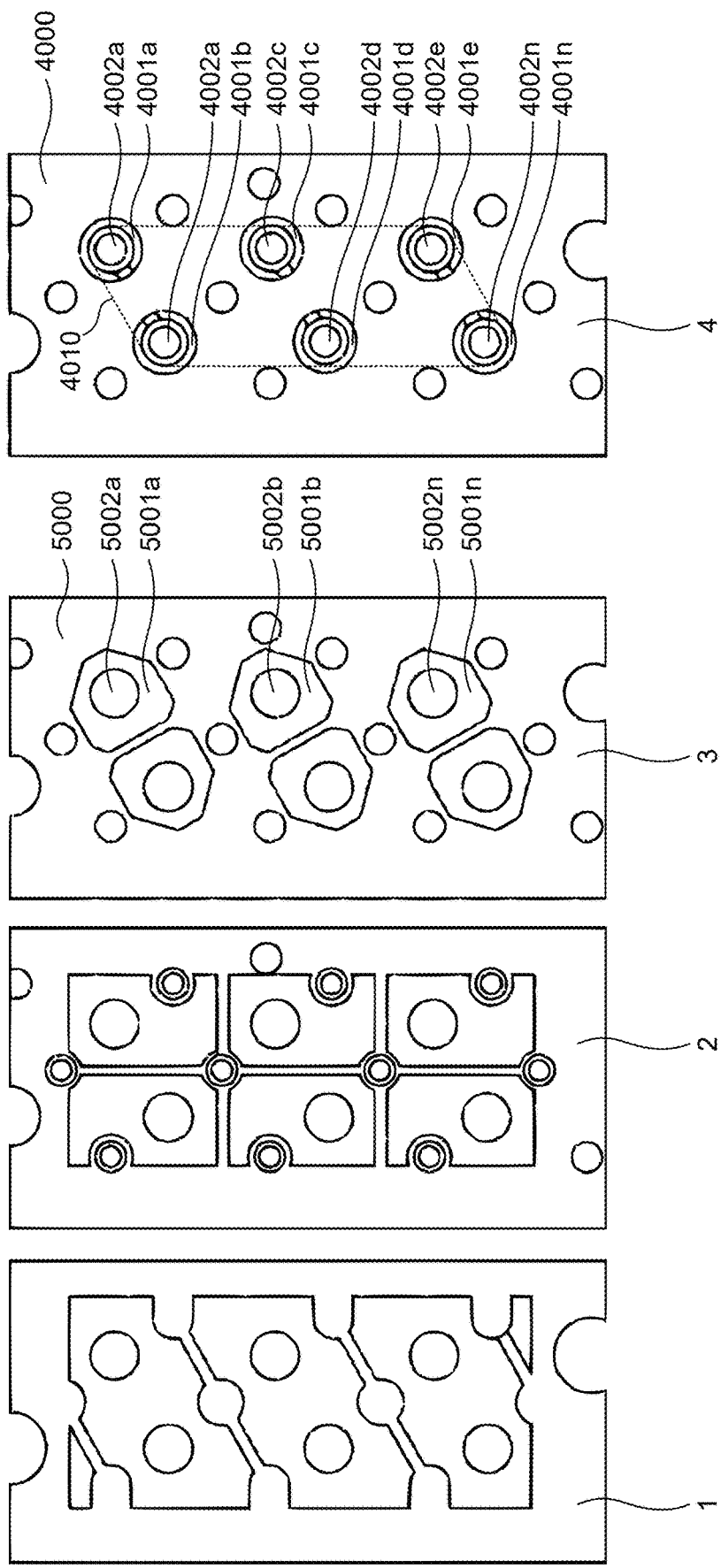
Figure 21:
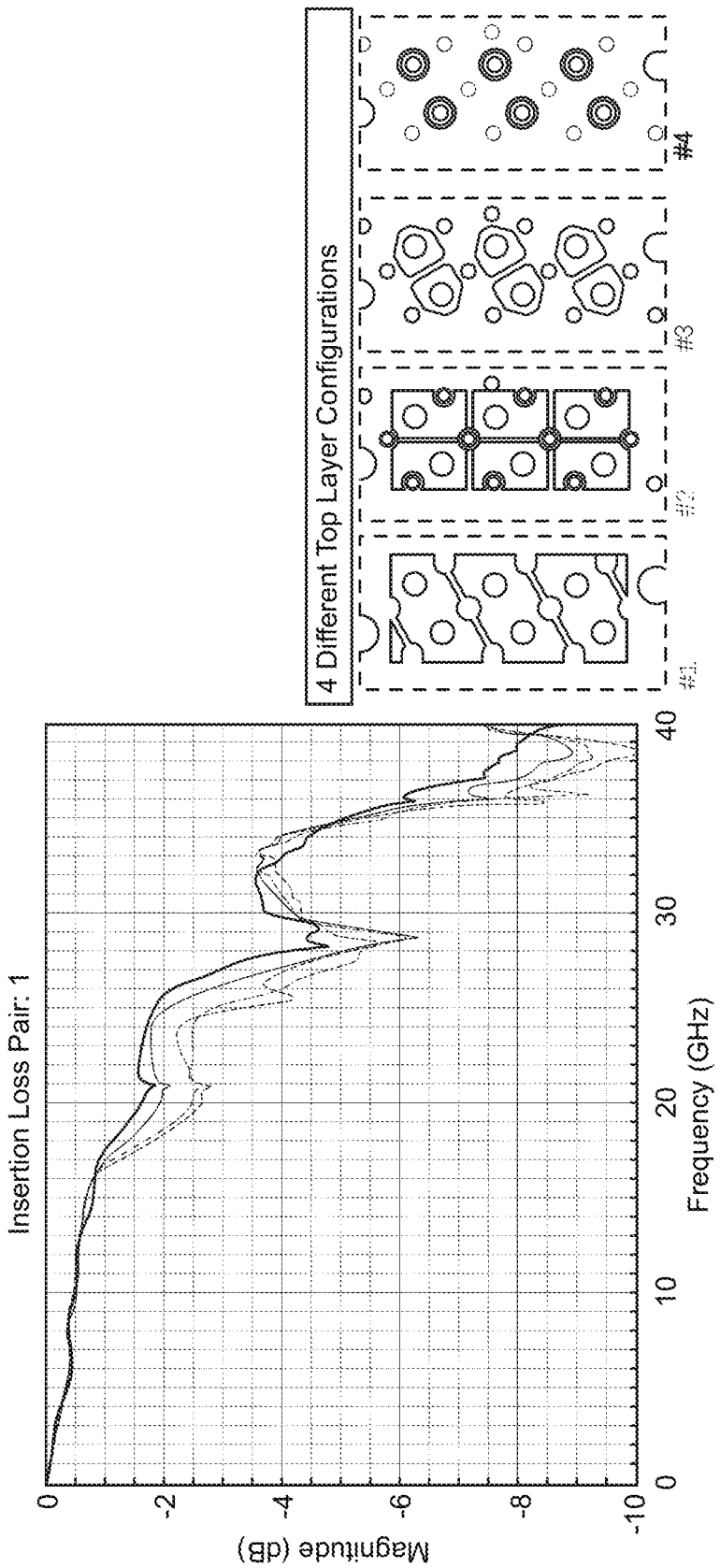
Figure 22:
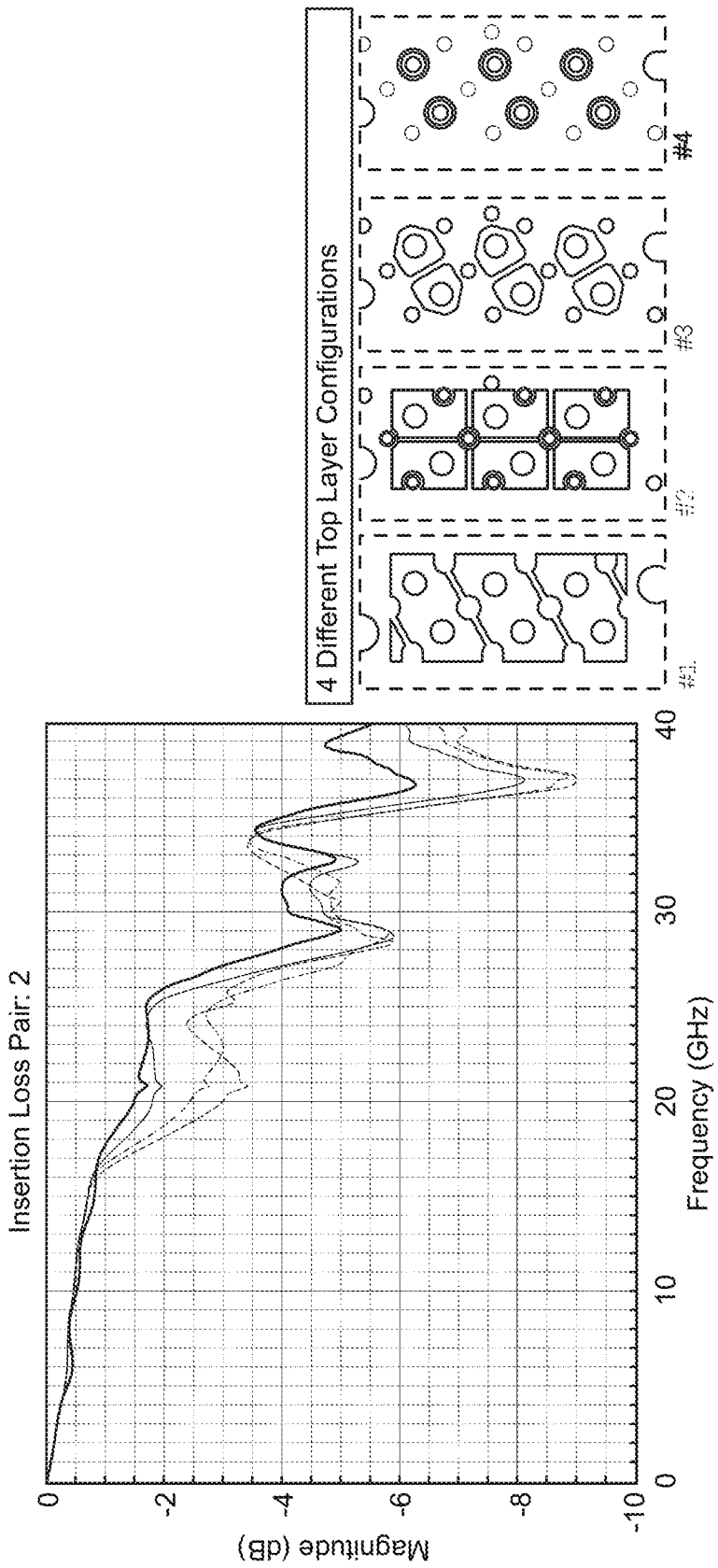
Figure 23:
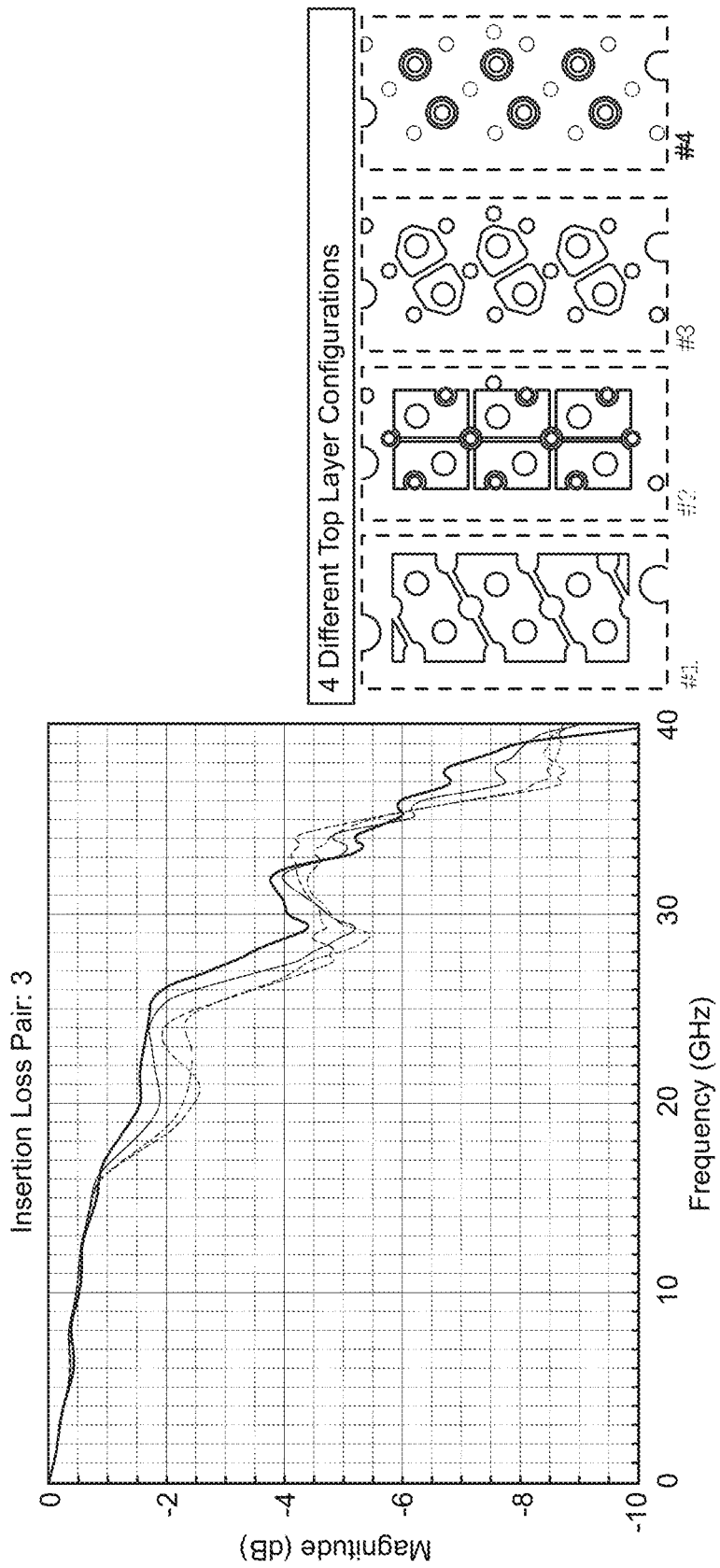
Figure 24:
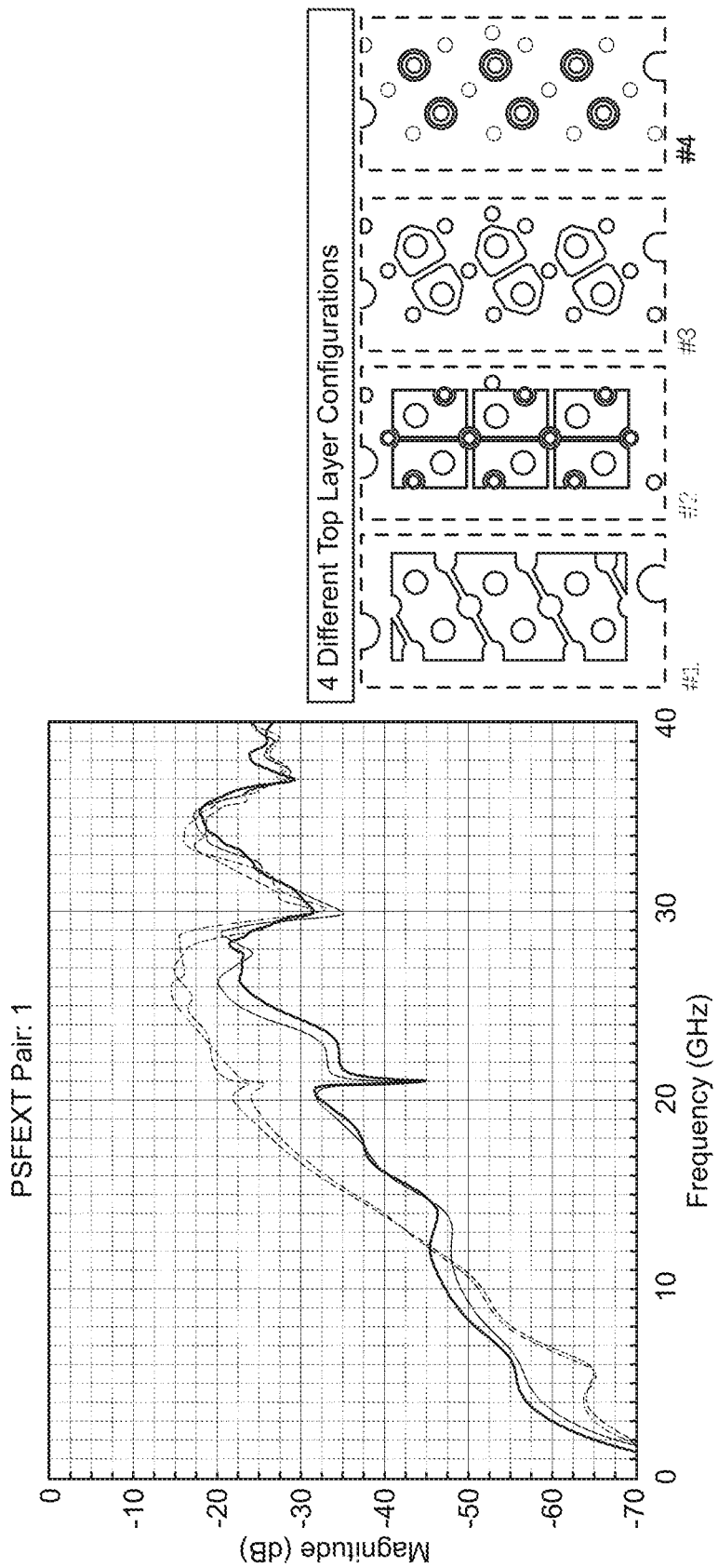
Figure 25:
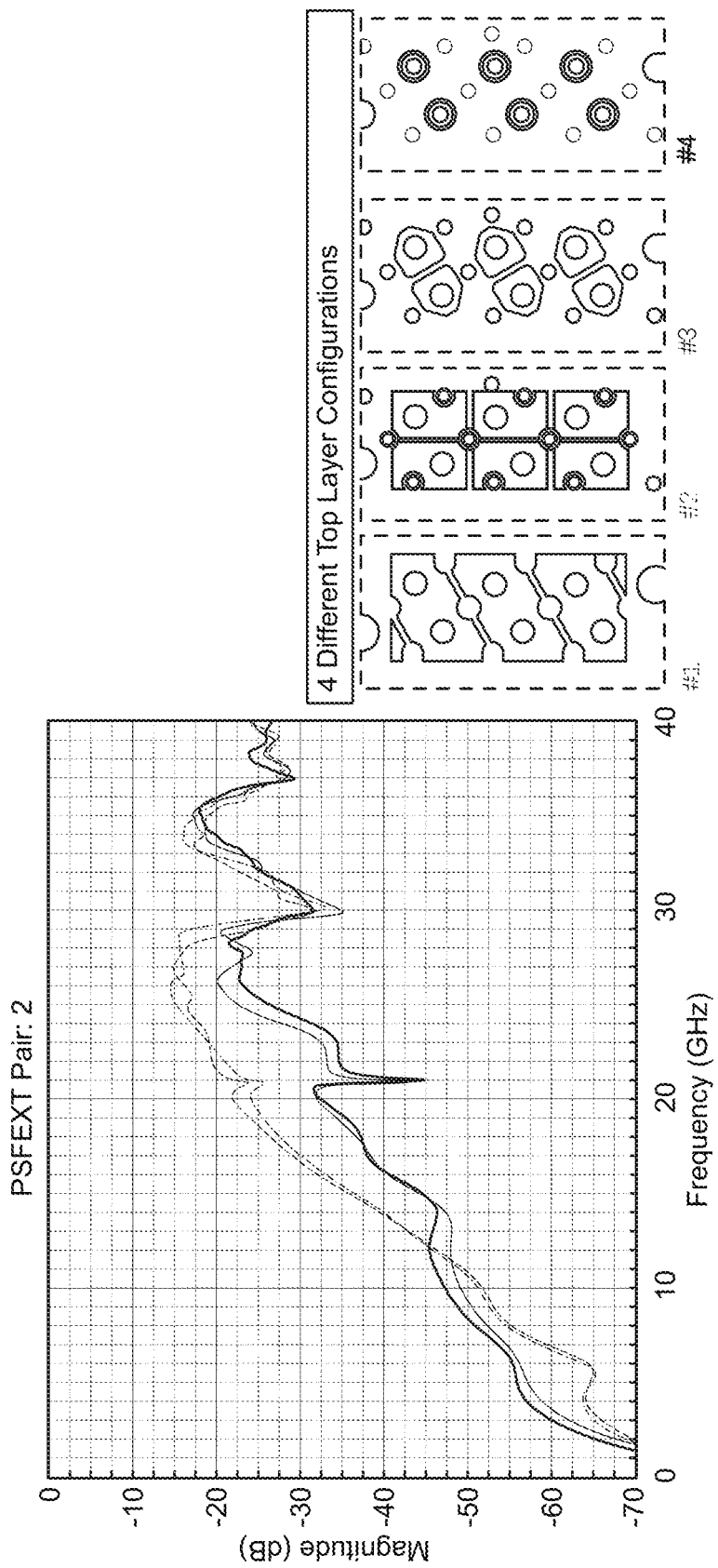
Figure 26:
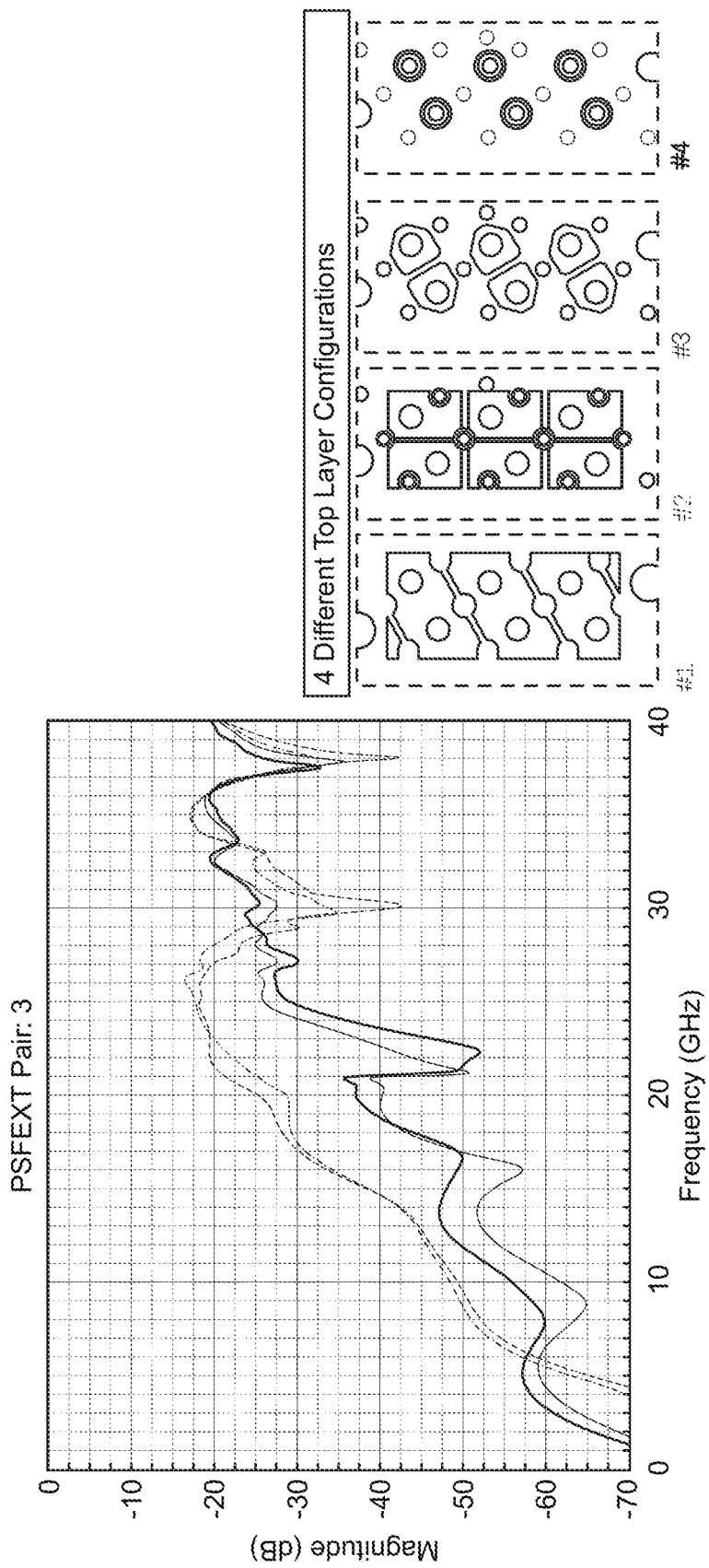
Figure 27:
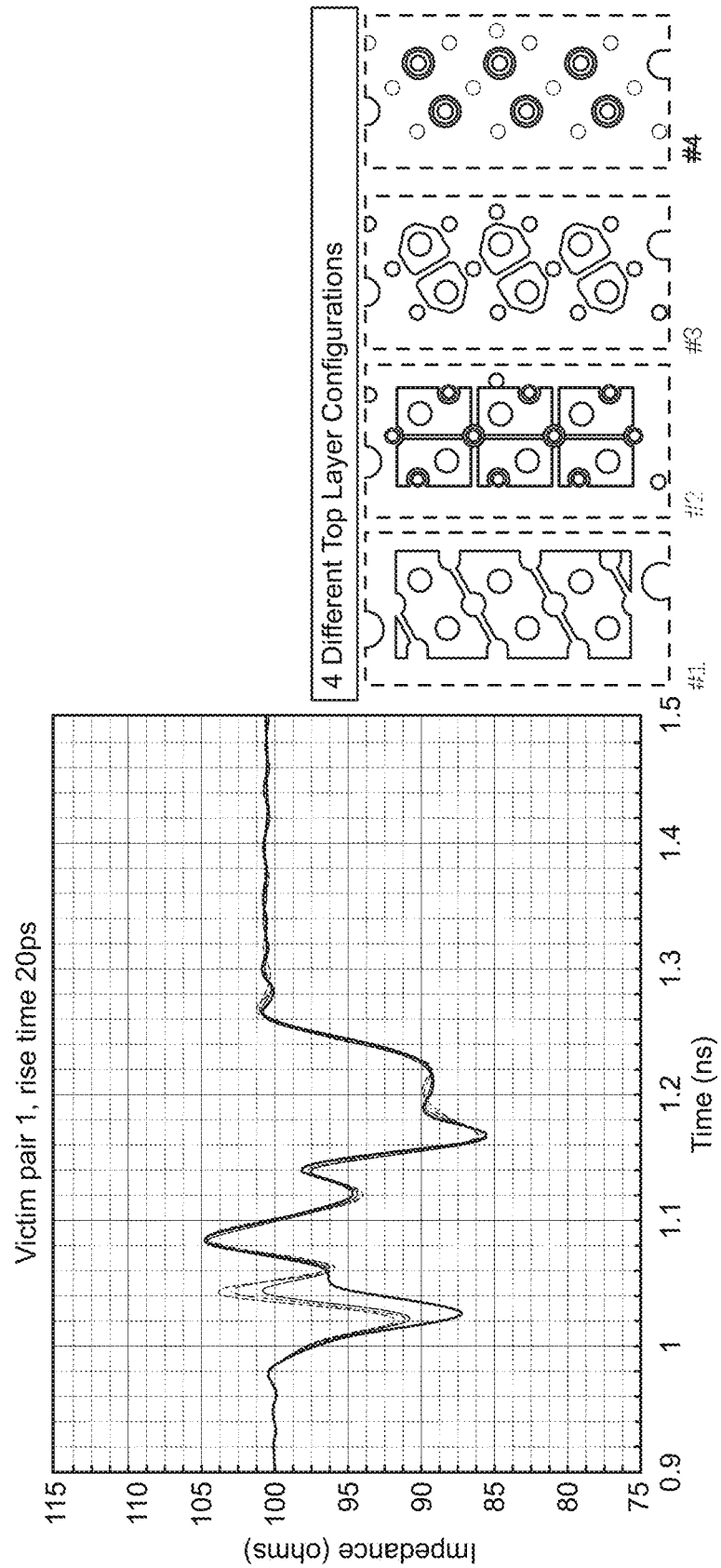
Figure 28:
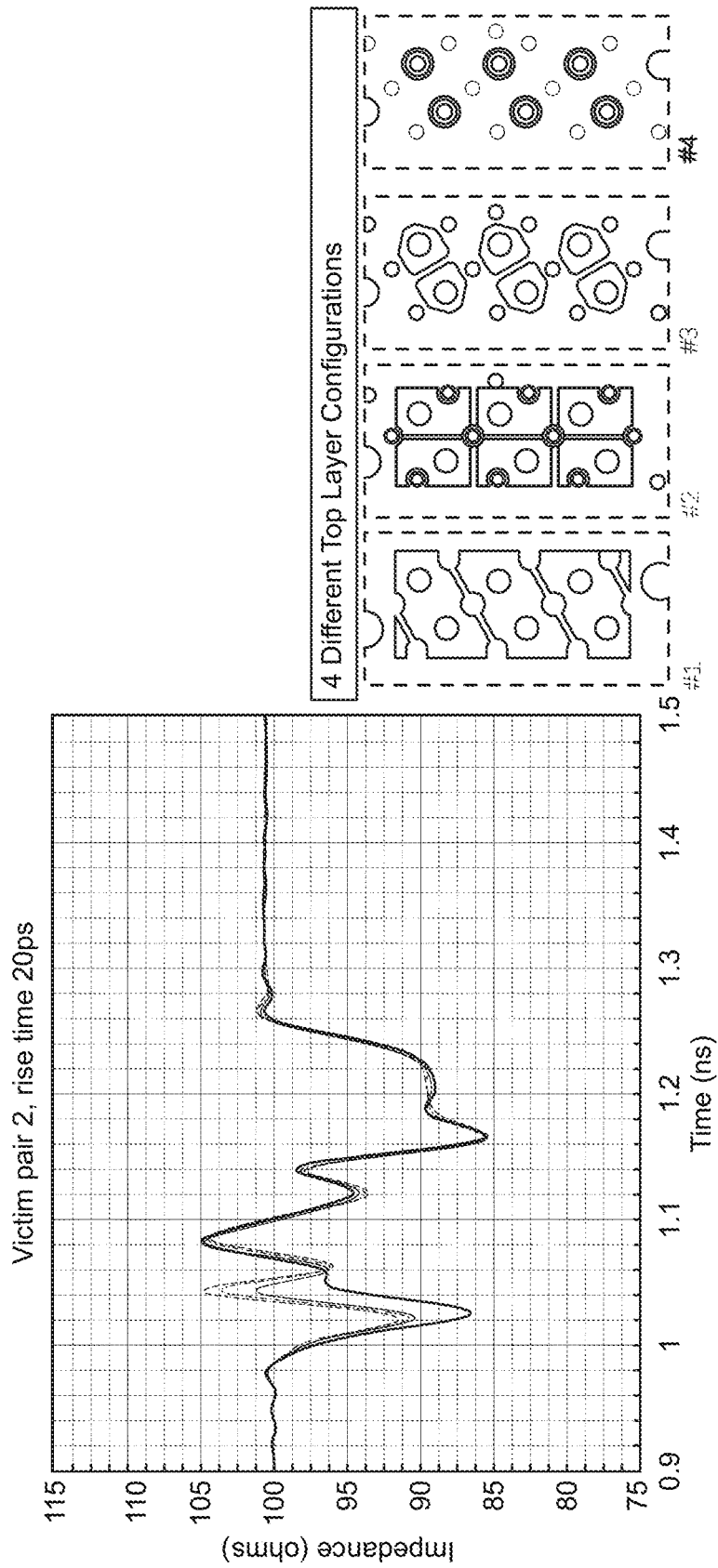
Figure 29:
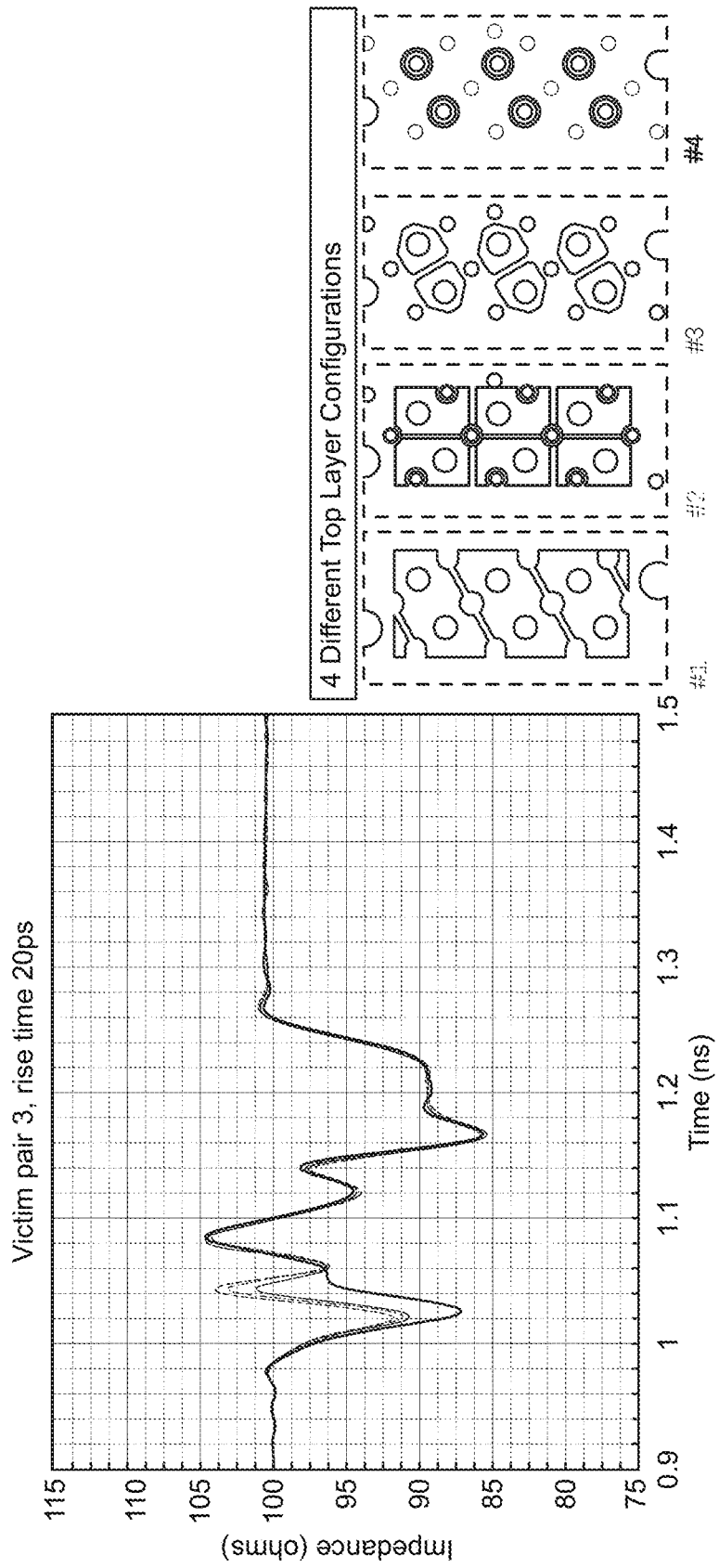
Figure 30:
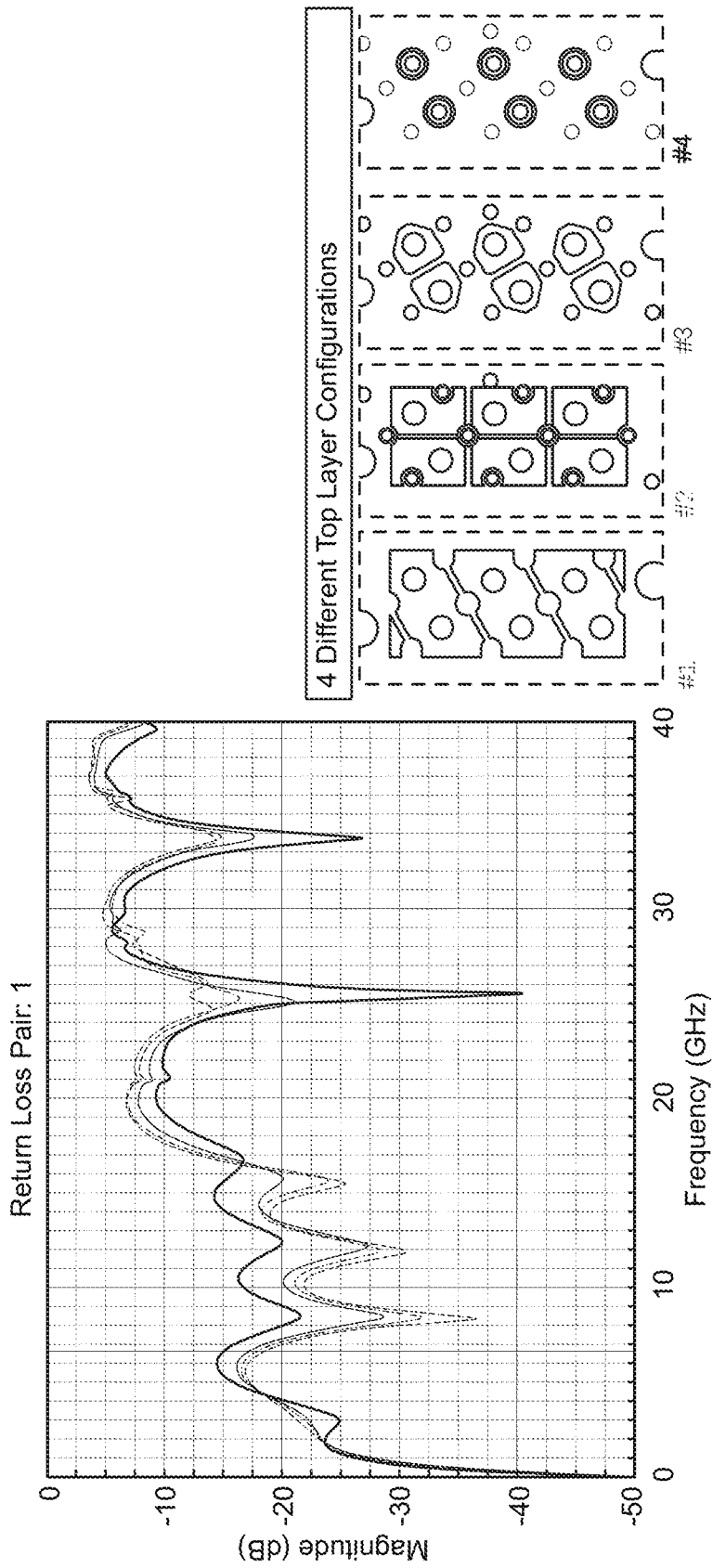
Figure 31:
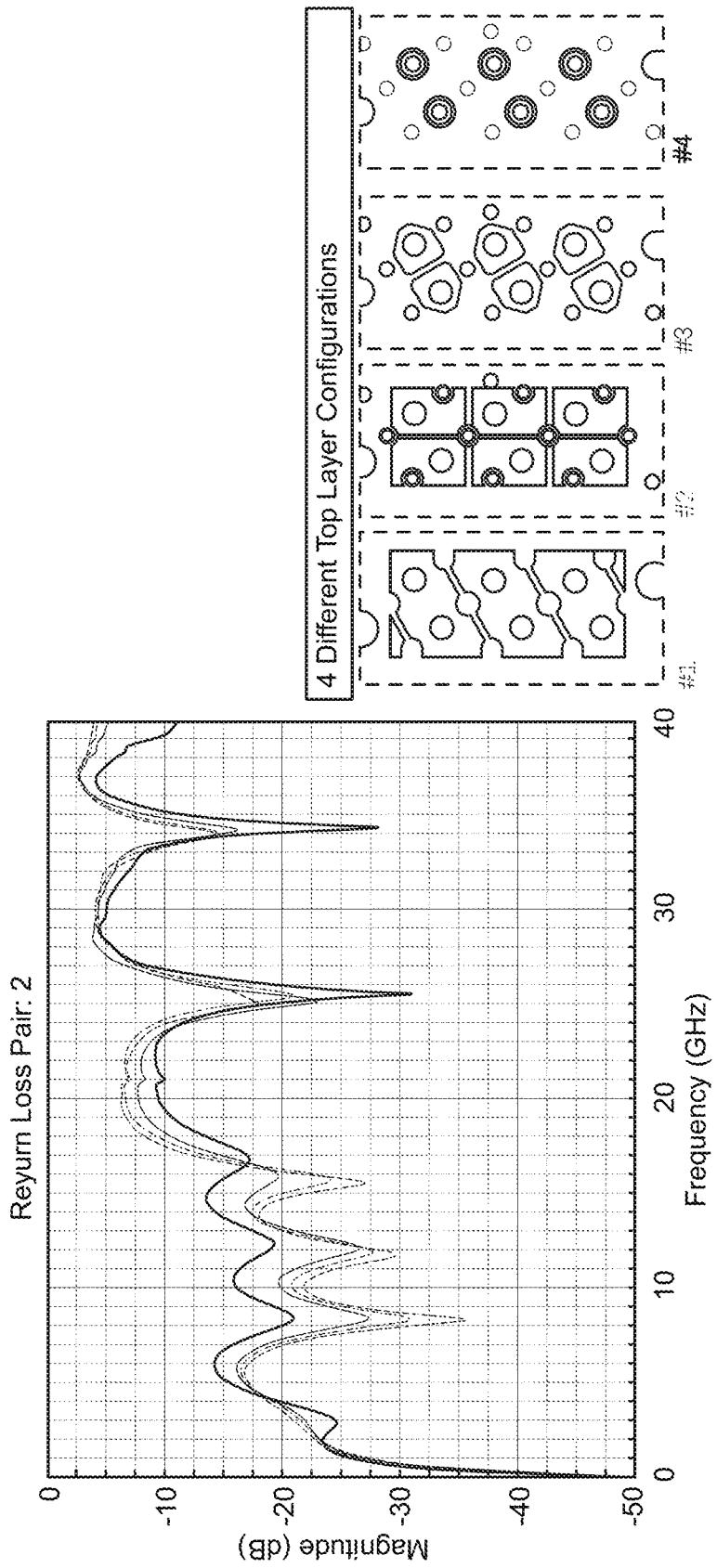
Figure 32:
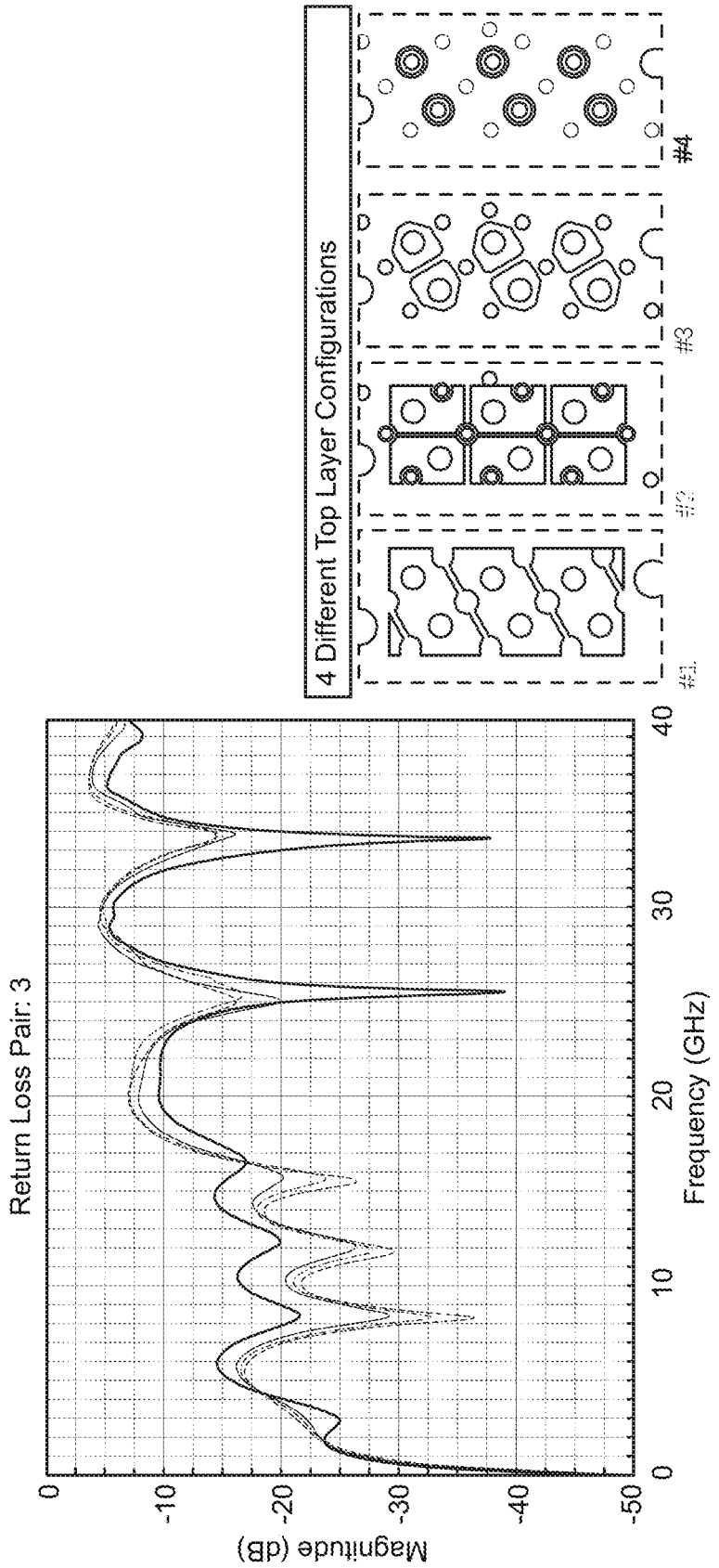

FIG. 20 shows all four of the exemplary, different PCB board mounting regions for PCBs 1-4 side-by-side. Referring to PCB 4 in FIG. 20 there is illustrated an exemplary surface area of a ground plane 4000, anti-pads 4001a-n, and the signal mounting position areas 4002a-n. Combined together, the anti-pad and signal mounting position surface areas form an "active port region" that is excited by the signal energy. Said another way, the combined exemplary surface areas of the anti-pads 4001a-n (where "n" denotes the last anti-pad) and exemplary surface areas of the signal mounting positions 4002a-n (where "n" denotes the last signal mounting position), where the total surface area of the anti-pads 4001a-n and total surface area of the signal mounting positions 4002a-n form an active port region. One of the objects of this invention is to inhibit coupling from a signal within one active port region to a signal within another active port region. An example mounting region 4010 is also shown in FIG. 20, and the outer boundary of the mounting region 4010 is formed between the outermost signal mounting positions 4002a-n. PCB 3 in FIG. 20 also includes a ground plane 5000 including ground mounting positions, anti-pads 5001a-n, and signal mounting positions 5002a-n positioned within the anti-pads 5001a-n.

It should be understood that a "first" percentage of the total surface area of each ground frame mounting region as described herein may be calculated by subtracting the surface area of the active port region from the total surface area of the ground frame mounting region 4000. Accordingly, as a first percentage in each PCB 1 through 4 increases, the second percentage represented as the active port region (4001a-n+4002a-n) in each PCB 1-4 decreases. Further, as the percent utilization of the ground frame progressively increases crosstalk progressively decreases.

FIGS. 21-32 illustrate exemplary graphs of insertion loss, crosstalk, impedance and return loss for each of the four exemplary PCBs and corresponding mounting surfaces in FIGS. 16-20 based on simulations completed by the inventors. As will be apparent from the graphs in FIGS. 21-32 the PCBs numbered 3 and 4—which include larger ground plane surface areas as a percentage of the total surface area of their respective mounting regions than PCBs numbered 1 and 2—provide reduced crosstalk as compared with PCBs numbered 1 and 2. Accordingly, as the inventive ground plane surface areas, as a percentage of the total surface area of a respective mounting region, increases and the total surface area of the anti-pads plus signal mounting positions (i.e. active port regions), as a percentage of the total surface area of the respective mounting region decreases, unwanted crosstalk decreases. The inventors further note that while crosstalk progressively diminishes with the increase in a ground frame utilization percentage, the signal line impedance may not be optimally matched with the use of a maximally diminished anti-pad area. Consequently, the exemplary anti-pad design illustrated in PCB 3 (shown in FIG. 20) shows an improved impedance match performance (see FIGS. 27-29) over the antipad design illustrated in PCB 4. Accordingly, by varying the anti-pad surface areas and ground frame utilization percentage the inventors have provided an inventive approach to identify trade-offs in performance-achieving reduced noise coupling while balancing the operational performance of ground coupled anti-pads for improved impedance match. In this manner, a good impedance match and reduced noise may be simultaneously balanced to achieve overall performance. A further advantage of the inventive approaches described herein is that they provide the ability to effectively balance both aspects of reduced noise coupling and impedance matching to optimize a connector and associated PCB interface for overall improved signal to noise transmission and impedance matching performance. In this manner it can be seen that the anti-pad design illustrated in exemplary PCB 3 shown in FIG. 20 provides a good impedance match while simultaneously providing a very good level of noise suppression.

While benefits, advantages, and solutions to problems have been described above with regard to specific embodiments of the present invention, it should be understood that such benefits, advantages, and solutions and any element(s) that may cause or result in such benefits, advantages, or solutions, or cause such benefits, advantages, or solutions to become more pronounced are not to be construed as a critical, required, or an essential feature or element of any or all the claims appended to the present disclosure or that result from the present disclosure.

We claim:

1. A printed circuit board comprising:
   a top surface for mounting a connector, the top surface comprising a plurality of signal mounting positions for the connector, a plurality of ground mounting positions for the connector, anti-pads around the plurality of signal mounting positions, and a mounting region with an outer boundary formed between outermost signal mounting positions; and
   a ground plane covering the top surface of the printed circuit board within the mounting region except for an active port region of the printed circuit board within the mounting region, the active port region comprising vias and the anti-pads within the mounting region, wherein a surface area of the ground plane covers at least 50% of a total surface area within the mounting region except the active port region.

2. The printed circuit board of claim 1, wherein the ground mounting positions comprise ground vias and the signal mounting positions comprise signal vias.

3. The printed circuit board of claim 1, wherein ground mounting positions comprise ground surface mount pads and the signal mounting positions comprise signal surface mount pads.

4. The printed circuit board of claim 1, wherein the anti-pads comprise at least one anti-pad around a pair of the signal mounting positions of the plurality of signal mounting positions.

5. The printed circuit board of claim 1, wherein the anti-pads comprise an anti-pad around each of the signal mounting positions of the plurality of signal mounting positions.

6. The printed circuit board of claim 1, wherein the surface area of the ground plane covers at least 60% of the total surface area within the mounting region except the active port region.

7. The printed circuit board of claim 1, wherein the surface area of the ground plane covers at least 70% of the total surface area within the mounting region.

8. The printed circuit board of claim 1, wherein the surface area of the ground plane covers at least 80% of the total surface area within the mounting region.

9. The printed circuit board of claim 1, wherein the surface area of the ground plane covers at least 90% of the total surface area within the mounting region.

10. A printed circuit board and connector assembly comprising:
   a printed circuit board comprising:
      a top surface comprising a plurality of signal mounting positions, a plurality of ground mounting positions, anti-pads around the plurality of signal mounting positions, and a mounting region with an outer boundary formed between outermost signal mounting positions; and
      a ground plane covering the top surface of the printed circuit board within the mounting region except for an active port region of the printed circuit board within the mounting region, the active port region comprising vias and the anti-pads within the mounting region, wherein a surface area of the ground plane covers at least 50% of a total surface area within the mounting region except the active port region; and
   a connector comprising:
      a plurality of wafers comprising a mounting face and an underside surface, the mounting face configured for mounting on the top surface of the printed circuit board, the underside surface comprising at least one conductive surface for a ground, the connector being configured for mounting on the printed circuit board such that an aperture between the at least one conductive surface and the ground plane of the printed circuit board is less than 0.3 mm,
      wherein the plurality of wafers comprise signaling wafers, the signaling wafers configured to support a plurality of signal terminals, and each of the plurality of signal terminals comprises a tail portion, a contact portion and a body portion extending between the contact portion and the tail portion.

11. The printed circuit board and connector assembly of claim 10, wherein the plurality of wafers comprise a plurality of ground wafers.

12. The printed circuit board and connector assembly of claim 11, wherein the at least one conductive surface comprises plated plastic edges of the plurality of ground wafers.

13. The printed circuit board and connector assembly of claim 11, wherein
   the plurality of ground wafers comprise tail inserts; and
   the at least one conductive surface further comprises a portion of the tail inserts positioned along the mounting region.

14. The printed circuit board and connector assembly of claim 10, wherein the plurality of wafers comprise a pair of ground wafers and a pair of signaling wafers, the pair of signaling wafers positioned adjacent to each other and the ground wafers positioned on either side of the adjacent signaling wafers.

15. The printed circuit board and connector assembly of claim 11, wherein the plurality of ground wafers comprise plated plastic.

16. The printed circuit board and connector assembly of claim 15, wherein the plurality of ground wafers comprise tail inserts.

17. The printed circuit board and connector assembly of claim 11, further comprising transverse ground blades electrically coupling the plurality of ground wafers.

18. The printed circuit board and connector assembly of claim 17, wherein the transverse ground blades comprise tails configured to electrically couple to the ground plane.

19. The printed circuit board and connector assembly of claim 18, wherein the plurality of ground wafers comprise tail inserts and the transverse ground blades interlock with the tail inserts.

20. The printed circuit board and connector assembly of claim 17, wherein the transverse ground blades extend across the plurality of ground wafers in a non-perpendicular direction.

* * * * *